(12) United States Patent
Rockett

(10) Patent No.: US 6,429,492 B1
(45) Date of Patent: Aug. 6, 2002

(54) LOW-POWER CMOS DEVICE AND LOGIC GATES/CIRCUITS THEREWITH

(75) Inventor: Leonard R. Rockett, Washington, DC (US)

(73) Assignee: BAE Systems Information and Electronic Systems Integration, Inc., Rockville, MD (US)

(*) Notice: Subject to any disclaimer, the term of this patent is extended or adjusted under 35 U.S.C. 154(b) by 0 days.

(21) Appl. No.: 09/598,681

(22) Filed: Jun. 21, 2000

Related U.S. Application Data

(60) Provisional application No. 60/140,361, filed on Jun. 23, 1999, and provisional application No. 60/164,343, filed on Nov. 9, 1999.

(51) Int. Cl.⁷ .............................................. H01L 29/72
(52) U.S. Cl. ...................... 257/368; 257/369; 257/371; 257/373
(58) Field of Search .......................... 257/368, 369, 257/371, 373

(56) References Cited

U.S. PATENT DOCUMENTS

| | | | |
|---|---|---|---|
| 4,024,418 A | * | 3/1977 | Hankel .......................... 257/368 |
| 4,326,136 A | | 4/1982 | Le Can et al. |
| 4,516,223 A | | 5/1985 | Erickson |
| 4,698,524 A | | 10/1987 | Plagen |
| 4,853,561 A | | 8/1989 | Gravrok |
| 4,868,904 A | | 9/1989 | Gravrok et al. |
| 5,111,074 A | | 5/1992 | Gravrok et al. |
| 5,128,731 A | | 7/1992 | Lien et al. |
| 5,268,323 A | | 12/1993 | Fischer et al. |
| 5,296,723 A | * | 3/1994 | Nobe et al. .................. 257/368 |
| 5,465,054 A | | 11/1995 | Erhart |

FOREIGN PATENT DOCUMENTS

DE 198 11 297 A 9/1998

OTHER PUBLICATIONS

Toyokazu Fujii et al: "Dual (N+/P+) Polycide Gate Technology Using Si–Rich WSIX to Exterminate Lateral Dopant Diffusion" Symposium on VLSI Technology, US, New York IEEE, vol. SYMP. 14,7 Jun. 7, 1994, pp. 117–118, XP000498609, ISBN: 0–7803–1922–2.

* cited by examiner

Primary Examiner—Edward Wojciechowicz
(74) Attorney, Agent, or Firm—Wallace G. Walter

(57) ABSTRACT

An insulated gate field effect transistor or a CMOS pair of transistors of a family of logic circuits includable in any type of integrated circuit, including microprocessors, memories and logic macros, and any or all functional portions thereof preferably forms an asymmetrical conduction device junction integrally with the gate structure to provide hysteresis that yields increased noise immunity and reduced power consumption and dissipation by asymmetric alteration of switching thresholds for positive and negative input signal transitions such that the turn-ON transition time or speed is slowed relative to the turn-OFF transition time or speed. The asymmetric conduction function is preferably provided by a polysilicon diode junction which is exposed and allowed to function as such by masking prior to application of a conductive material to the gate structure.

23 Claims, 17 Drawing Sheets

| Noise Margin<br>Modified CMOS Inverter | Noise Margin<br>Conventional CMOS Inverter |
|---|---|
| $NM_H(MD) = V_{oh} - V_{T-}$<br>$NM_L(MD) = V_{T+} - V_{ol}$ | $NM_H(CD) = V_{oh} - V_{ih}$<br>$NM_L(CD) = V_{il} - V_{ol}$ |

LOW-POWER CMOS DEVICE AND LOGIC GATES/CIRCUITS THEREWITH

CROSS REFERENCE TO PROVISIONAL PATENT APPLICATIONS

This application claims the benefit of the filing date of and commonly owned U.S. Provisional Patent Application No. 60/140,361 filed Jun. 23, 1999 and U.S. Provisional Patent Application No. 60/164,343 filed Nov. 9, 1999 by the applicant herein.

TECHNICAL FIELD

The present invention relates to a low-power CMOS device and logic gates/circuits therewith and, more particularly, to electrical circuits having enhanced noise tolerance.

BACKGROUND ART

Complementary metal-oxide-semiconductor (CMOS) devices and circuitry are used extensively to implement digital logic circuits. CMOS circuitry exhibits two exemplary characteristics: low-power consumption and high noise tolerance.

Because of these characteristics and because such circuitry is relatively inexpensive to fabricate and has relatively high reliability, CMOS devices, rather than bipolar and N-type MOS transistors, are predominately used to make integrated circuits.

The elemental CMOS circuit is a conventional CMOS inverter 100, illustrated in FIG. 1A. The CMOS inverter 100 includes a N-type MOS field effect transistor (N-MOSFET) 120 and a P-type MOS field effect transistor (P-MOSFET) 140 coupled in series. The gate electrodes 160 and 180, respectively, of the N-MOSFET 120 and the P-MOSFET 140 are coupled together to form the input 190 of the conventional CMOS inverter 100. Drain/source nodes of the N-MOSFET 120 and P-MOSFET 140 are coupled together to form the output 170 of the conventional CMOS inverter 100. The other source/drain nodes and the body connections of the P-MOSFET 140 and the N-MOSFET 120 device are respectively coupled to a supply voltage $V_{dd}$ 130 and to ground (GND) 150. As used herein, the terms source/drain (and drain/source) are used to refer to both drain and source regions of MOSFET transistors. This nomenclature reflects the interchangeability of the drain and source regions in a MOSFET device, where a particular designation of source or drain depends on the voltages applied to each of these regions.

Operation of the conventional CMOS inverter 100 is well known to persons skilled in the art of circuit design. The corresponding voltage transfer characteristic (VTC) 101 (i.e., $V_{out}$ versus $V_{in}$ plot) for the conventional CMOS inverter 100 is illustrated in idealized form in FIG. 1B. The VTC 101 includes four operating regimes, I, II, III, IV, that occur when switching from one logic state to the other. In regime I, the P-MOSFET is ON and the N-MOSFET is OFF, in region II, the P-MOSFET is in its linear region while the N-MOSFET is in saturation, in region III, the P-MOSFET is in saturation while the N-MOSFET is in its linear region, and, lastly, in region IV, the P-MOSFET is OFF and the N-MOSFET is ON. At the transition between regimes II and III, both the N-MOSFET and the P-MOSFET are simultaneously conducting; as discussed below, it is at this transition that the circuit is momentarily short-circuited between $V_{dd}$ and circuit ground 150. The VTC 101 of the conventional CMOS inverter 100 illustrates that the voltage logic level at the output 170 is the logical inverse of the voltage logic level at the input 190.

At least three sources of power dissipation exist in a CMOS circuit, such as the conventional CMOS inverter 100 of FIG. 1A:

(1) switching power dissipation;
(2) short-circuit power dissipation; and
(3) static power dissipation resulting from reverse-biased PN junction leakage currents.

The switching power is the power dissipated each full cycle due to the successive charging and discharging of the capacitive load tied to the output node of a CMOS circuit (e.g., output 170 of the conventional CMOS inverter 100). Switching power is generally the largest component of total CMOS circuit power dissipation. CMOS circuit switching power consumption may be significantly reduced by diminishing the load capacitance coupled to the output of the CMOS circuit. Such load capacitance is typically the input capacitance of a successively coupled CMOS circuit. CMOS circuit input capacitance (e.g., load capacitance) is principally reduced by reducing MOSFET gate lengths in the CMOS circuits.

Short-circuit power consumption is the momentary direct-path DC power that is dissipated by the CMOS circuit each time its logic input conditions cause its output to change from one logic state to the other logic state. Short-circuit power consumption is due to the short-circuit path that arises at the transition between regimes II and III in FIG. 1B during output state changes when the serially coupled N-MOSFET 120 and P-MOSFET 140 are simultaneously conductive (e.g., turned ON), so that current flows from a power supply $V_{dd}$ to ground 150. During this conduction period (i.e., when both MOSFETs 120, 140 are simultaneously substantially turned ON), short-circuit power is dissipated in the MOSFETs output conductances and parasitic resistances. While the conduction period for short-circuit current is very short for each logic state transition, at higher switching speeds, the conduction period can become a successively higher and more significant fraction of the clock cycle resulting in significant short-circuit power dissipation.

Finally, static leakage power consumption is due to the small leakage currents that arise from reverse-biased PN junctions (and sub-threshold effects). Static leakage power consumption is generally the smallest component of total CMOS circuit power dissipation.

In addition to their relatively low power consumption, CMOS circuits, operating at conventional supply voltages (e.g., five volts), have relatively high noise tolerance, and thus are more accepting of variations in input signal levels. The high noise tolerance of CMOS circuits better assures the accuracy of CMOS circuit signal processing, even in relatively noisy environments.

Having a relatively high noise tolerance permits a CMOS circuit to interpret input signals within a relatively large voltage range near either logic state voltage (e.g., outside a relatively small range approximately centered at one-half the power supply voltage) as either a logic '0' or as a logic '1'. This ability allows CMOS circuitry to better tolerate noise, for example, generated within or outside of the CMOS circuitry as will be later described.

Such enhanced noise tolerance for CMOS circuitry may be quantified by a measures known as noise margins. FIG. 1B illustrates four output and input voltage levels, of the conventional CMOS inverter 100, used to quantify noise tolerance.

1. $V_{oh}$=Minimum logic '1' output voltage (20)
2. $V_{ol}$=Maximum logic '0' output-voltage (40)

3. $V_{ih}$=Minimum input voltage recognized as logic '1' (80)

4. $V_{il}$=Maximum input voltage recognized as logic '0' (60)

Typically, $V_{oh}$ 20 equals the supply voltage ($V_{dd}$) 130 and $V_{ol}$ 40 equals zero volts, or ground (GND) 150.

Two noise margins (respectively, for the high, or logic '1', and low, or logic '0', states) may be defined as follows:

1. Noise Margin High: $NM_H = V_{oh} - V_{ih}$
2. Noise Margin Low: $NM_L = V_{il} - V_{ol}$ High noise margins, or tolerance to variations in the signal level, are especially valuable in environments having circuit noise that can significantly corrupt signals. The circuit noise may be undesirable signals coupled to the CMOS circuit. Such circuit noise may be coupled from neighboring transmission lines (e.g., in a highly integrated circuit) or coupled from other sources by capacitive or inductive coupling. Such noise may cause the voltage level at a node in a CMOS circuit to significantly vary, potentially affecting the logic states at that and other circuit nodes. The high noise tolerance of CMOS circuits generally ensures that both noisy and noiseless input signals presented to a CMOS circuit are interpreted properly.

Because transistor dimensions are continuing to decrease, the density (e.g., device density) of CMOS integrated circuits continues to increase. As a result, CMOS circuit noise margins are undesirably declining as device density increases.

Increased density increases the power dissipation per unit area of CMOS circuits; increased power dissipation may diminish CMOS circuit reliability.

Further, the power consumption of highly integrated CMOS circuits may increase beyond the capacity of available power supplies. Thus, to diminish power dissipation, CMOS circuit power supply voltage levels have been reduced, for example, from 5 volts to 3.3 volts to 2.5 volts and to 1.8 volts. The reduction of power supply voltages has detrimentally diminished CMOS circuit noise margins because of the corresponding reduction of $V_{oh}$ 20, $V_{ol}$ 40, $V_{ih}$ 80, and $V_{il}$ 60. Further, the use of lower power supply voltages has given rise to an even greater need for higher CMOS circuit noise margins. CMOS circuits operating with reduced supply voltages may incorporate voltage level conversion circuitry to provide, for example, higher voltage levels within the CMOS circuits. Such conversion circuitry, however, can significantly increase noise levels within the CMOS circuits. Also, as both circuit density and operating speeds rise, capacitively and inductively coupled noise is increased in the CMOS circuits.

A Schmidt trigger 151, illustrated in FIG. 1C, is a switching inverter that has higher noise margins than a conventional CMOS inverter 100. One common application of Schmitt triggers 151 is to provide a clean square-wave voltage output for any applied input voltage waveform when any portion of the input waveform exceeds the triggering threshold of the Schmidt trigger. The Schmidt trigger 151 includes six transistors 152, 153, 154, 155, 156, and 157. Hence, the Schmidt trigger 151 is relatively large in comparison to the conventional CMOS inverter 100, and thus more expensive to fabricate. Further, the Schmidt trigger 151 dissipates more power than the conventional CMOS inverter 100.

Therefore, there is a need for increased noise margins in state-of-the-art CMOS circuits operating at relatively low power supply voltages. Further, because digital logic switching speeds are increasing, there is a need to diminish short-circuit power dissipation in state-of-the-art CMOS circuits. Additionally, there is a need to minimize the size of such circuits.

DISCLOSURE OF INVENTION

The above-mentioned problems with CMOS circuitry and other problems are addressed by a device according to the resent invention, which includes a field effect transistor and an interconnect having gate and wiring regions where the interconnect forms a gate of the field effect transistor in the gate region thereof and includes a diode junction formed therein in the wiring region. The diode junction imparts a diode characteristic between portions of the wiring region and the transistor.

Typically, the interconnect includes polycrystalline semiconductor material such as polysilicon. The interconnect may also include a silicide layer disposed in a conducting relationship with the polycrystalline semiconductor material. However, the silicide layer is absent in a diode region surrounding the diode junction of the interconnect. The diode region acts to delay transistor turn-ON relative to transistor turn-OFF, which effect may be exploited to reduce power dissipation and increase noise immunity of circuits employing the devices according to the present invention.

In accordance with another aspect of the present invention, a logic circuit having enhanced noise immunity includes at least two transistors and an interconnect forming a gate of the at least two transistors in at least two gate regions. The interconnect also forms a wiring region outside of the gate regions. The interconnect further includes at least two diode junctions formed therein in the wiring region, the diode junctions imparting diode characteristics between a portion of the wiring region and the gate regions.

In accordance with another aspect of the present invention, a circuit having enhanced noise immunity includes a pair of transistors, each including a gate. A pair of diodes serially couples a signal to respective ones of the gates. In so doing, the diodes affect the transition of the transistors between their ON and OFF states in response to transitions of the drive signal, where the transition from ON to OFF is faster than the transition from OFF to ON.

In accordance with another aspect of the present invention, an apparatus includes-an electronic system and a memory and/or processor coupled to the electronic system. The memory or processor coupled to the electronic system includes a pair of transistors, each having a gate and a pair of diodes. Each of the diodes serially couples a signal to respective ones of the gates. In so doing, the diodes affect the transition the transistors between their ON and OFF states in response to transitions of the signal. The diodes affect the transition of the pair of transistors from ON to OFF faster than from OFF to ON.

In accordance with another aspect of the invention, a method of fabricating a transistor in a semiconductor includes first and second steps of forming and an implanting step. In the first forming step, a polycrystalline semiconductor is formed over a gate oxide in a gate region and over a field oxide in a wiring region of the semiconductor. In the implanting step, impurities are implanted into the semiconductor to form a transistor in the gate region and a diode junction in the wiring region of the polycrystalline semiconductor. Then in the second forming step, a conductive coating is formed on the polycrystalline semiconductor except in a region around the diode junction. Typically, the polycrystalline semiconductor is polysilicon and the conductive coating is silicide. However any other suitable materials that provide the desired functionality may be used.

In accordance with another aspect of the invention, a method of operating a device that includes a field effect transistor and an interconnect forming a gate of the field effect transistor is provided. The interconnect has an input terminal and a diode junction between the input terminal and the gate. The method includes applying and propagating steps. In the applying step, a signal is applied to the input terminal and, in the propagating step, the signal is propagated through the diode junction to the gate.

In accordance with another aspect of the invention, a method of imparting enhanced noise immunity to a circuit includes steps of dividing, conveying, and delaying or slowing. In the dividing step, a received signal is divided into first and second signals. Then, in the conveying step, the first and second signals are separately conveyed to respective first and second transistors. In the delaying or slowing step, signal transitions on the signals conveyed to each of the first and second transistors are slowed when the signal transition tends to transition the corresponding transistor ON.

The gate structure and gate connection in accordance with the transistors, logic circuit family, and integrated circuits designed and fabricated in accordance with the invention provide a gate structure and connection that includes an asymmetrical conduction function, preferably with an exposed diode junction that provides hysteresis to improve noise immunity and preferably delays the turn-ON time relative to the turn-OFF time to maintain one transistor of a CMOS pair of transistors in the OFF state during part or all of the switching turn-OFF period of the other and thus reduce short-circuit power consumption and dissipation. A series-connected polycrystalline diode having reduced forward conduction current and increased reverse leakage current in comparison with single crystalline diodes is a preferred component of the gate structure and connection providing the desired asymmetric conduction and transistor switching function. The transistor design and fabrication need not otherwise be altered to accommodate inclusion of the invention.

It is therefore an object of the present invention to provide a CMOS logic circuit family having significantly improved noise immunity and reduced power consumption.

It is another object of the invention to provide a CMOS transistor design which provides significantly improved noise immunity and reduced power consumption in digital logic circuits without significant compromise of switching speed.

It is a further object of the invention to provide circuits having a comparable degree of noise immunity and reduced power consumption to known circuits specifically. designed for such purposes but with fewer CMOS transistors and improved performance.

BRIEF DESCRIPTION OF THE DRAWINGS

The present invention is described below, by way of example, with reference to the accompanying drawings, wherein.

BEST MODE FOR CARRYING OUT THE INVENTION

In the following detailed description of the illustrative embodiments, reference is made to the accompanying drawings which form a part hereof, and in which is shown, by way of illustration, specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense. The illustrative embodiments described herein concern electrical circuitry which use voltage levels to represent binary logic states; namely, a "high" logic level and a "low" logic level also designatable, respectively, by logic "1" and logic "0".

Figure 1A:
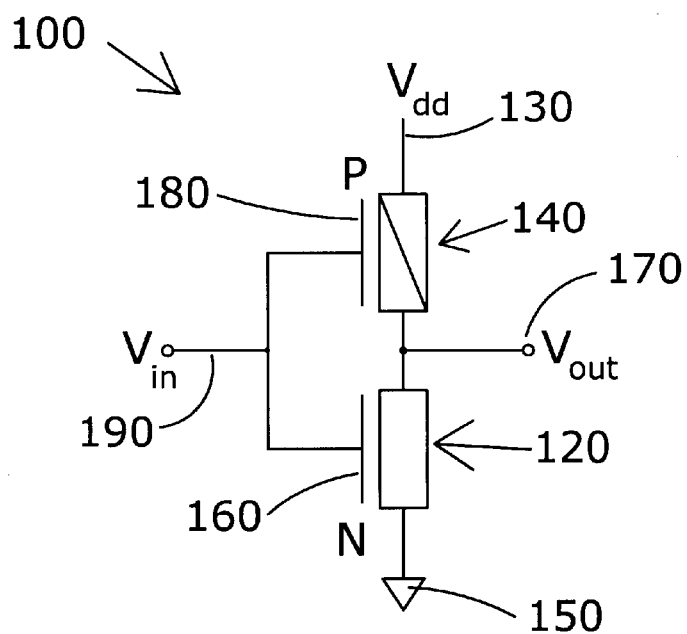
FIGS. 1A and 1B are respective schematic diagrams of a conventional CMOS inverter and an idealized voltage transfer characteristic (VTC) thereof.
Figure 1B:
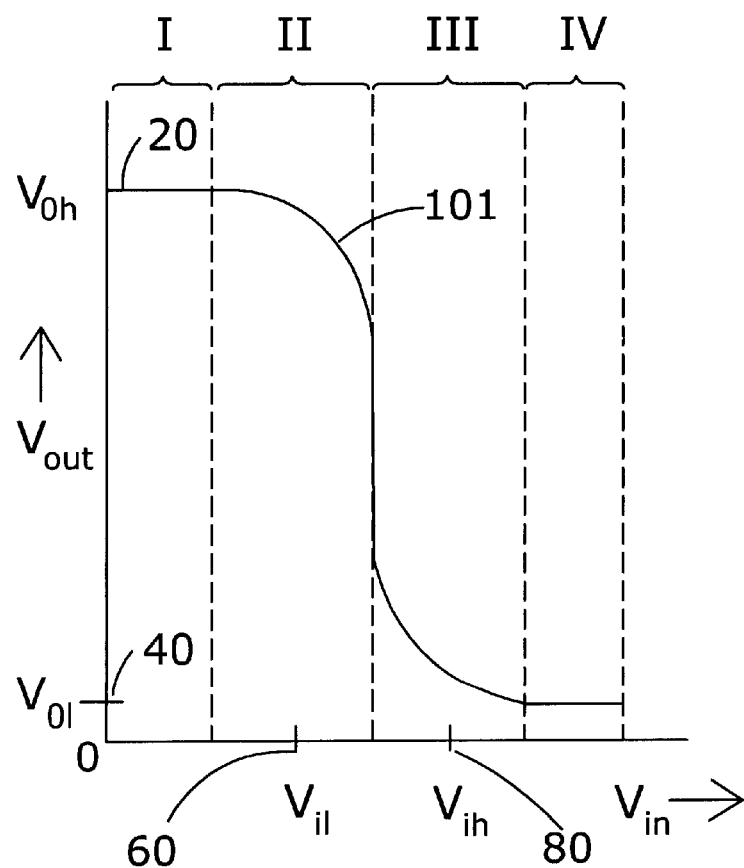
Figure 1C:
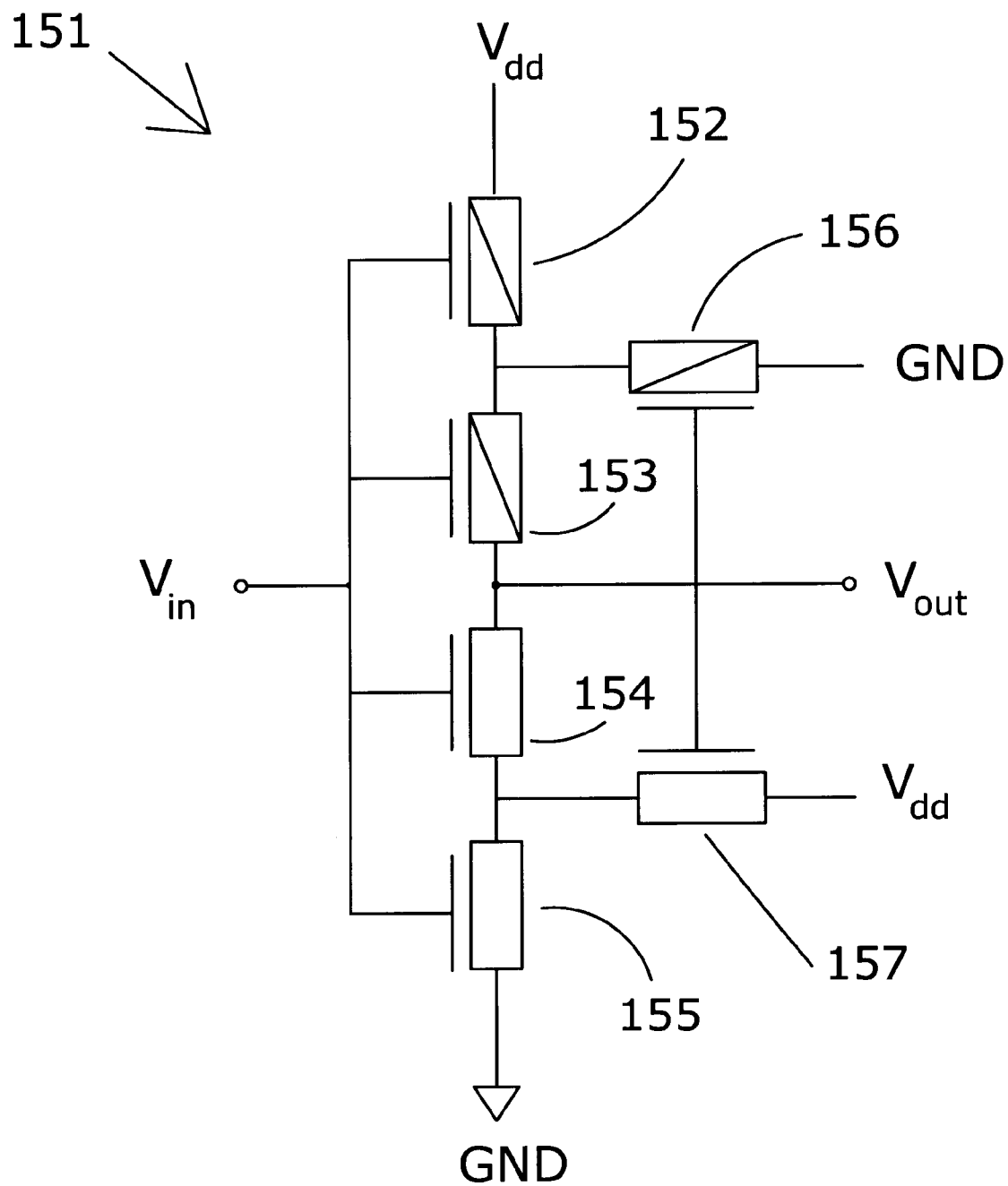
FIG. 1C illustrates a conventional Schmidt trigger.
Figure 2A:
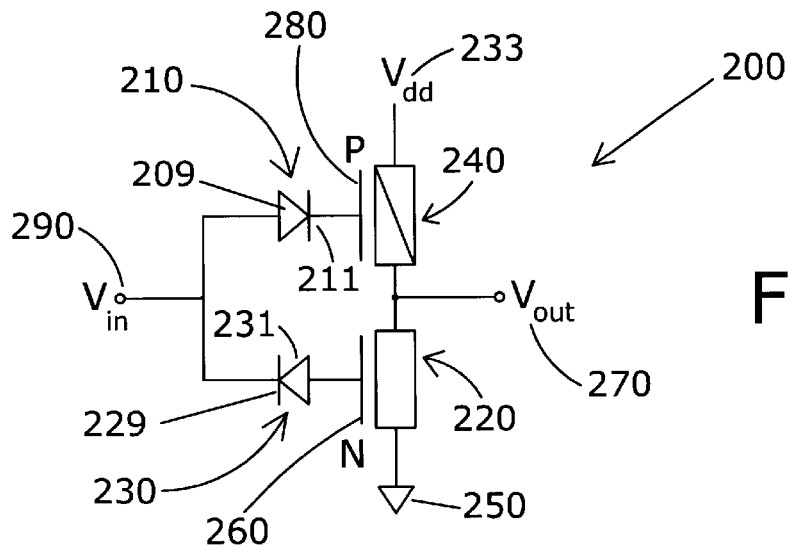
FIGS. 2A, 2B, and 2C are respective schematic diagrams of embodiments of a CMOS inverter in accordance with the present invention.
Figure 2B:
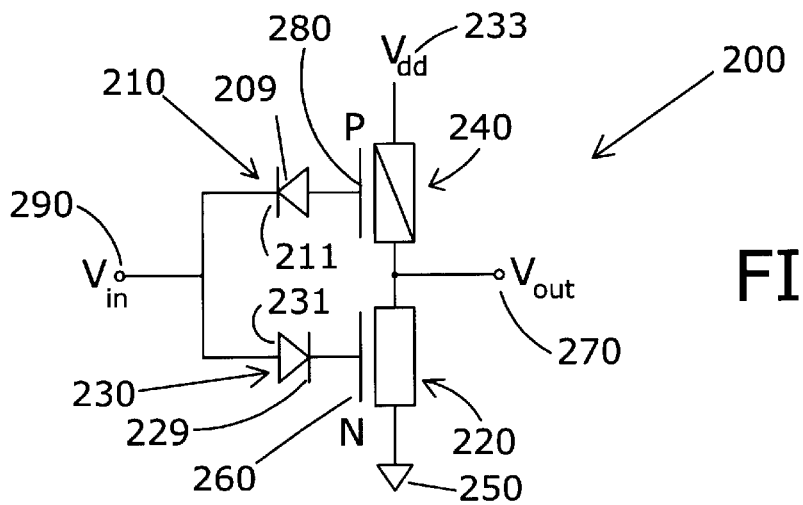
Figure 2C:
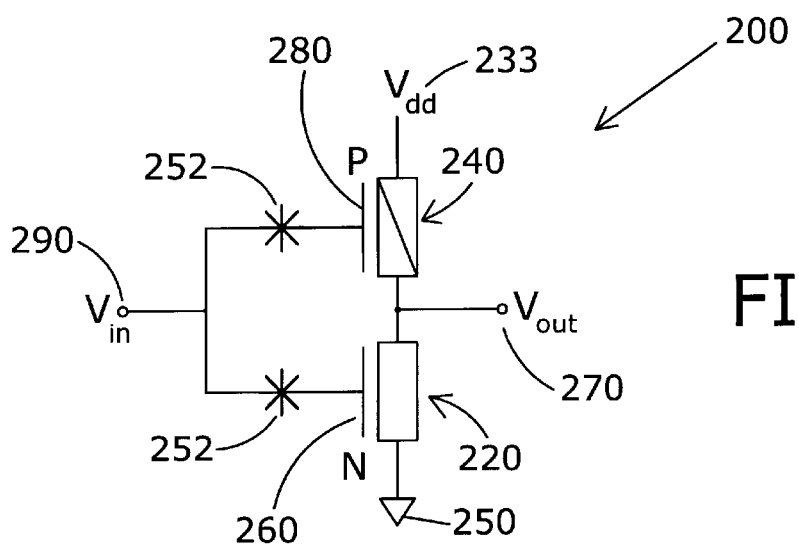

FIGS. 2A, 2B, and 2C are schematic diagrams of exemplary embodiments of the modified CMOS inverter 200 according to the present invention. In FIGS. 2A and 2B, the modified CMOS inverter 200 is defined by a N-MOSFET 220 and a P-MOSFET 240 coupled in series. The gate electrodes 260 and 280 of the N-MOSFET 220 and the P-MOSFET 240 are respectively coupled, in series, to two diodes 230, 210 (i.e., where the anode of one diode is coupled to the cathode of the other diode at the input 290 of the modified CMOS inverter 200). Because the diodes 210, 230 may be placed in either of these two sets of opposite orientations, as described below, the serially coupled pair of diodes 210, 230 may be schematically generalized and represented by a pair of asterisk symbols 252, as illustrated in FIG. 2C, when diode orientation need not be shown.

FIG. 2A illustrates one embodiment of the modified CMOS inverter 200 having a specific diode orientation. In this embodiment, the cathode 211 of the diode 210 is coupled to the gate 280 of the P-MOSFET 240. The anode 231 of diode 230 is coupled to the gate 260 of the N-MOSFET 220. The anode 209 of diode 210 and the cathode 229 of diode 230 are coupled together to form the input 290 of the modified CMOS inverter 200. Drain/source nodes of the N-MOSFET 220 and P-MOSFET 240 are coupled together to form the output 270 of the CMOS inverter 200. The other source/drain nodes and the body-connections of the P-MOSEFET 240 and the N-MOSFET 220 are respectively coupled to the power supply voltage $V_{dd}$ 233 and to ground (GND) 250.

In an alternative embodiment of the modified CMOS inverter 200, illustrated in FIG. 2B, the orientation of the diodes 210, 230 may be reversed relative to that shown in FIG. 2A. Thus, the anode 209 of diode 210 is coupled to the gate 280 of the P-MOSFET 240, and the cathode 229 of diode 230 is coupled to the gate 260 of the N-MOSFET 220. The cathode 211 of diode 210 and the anode 231 of diode 230 are coupled together to form the input 290 of the modified CMOS inverter 200.

Operation of the modified CMOS inverters 200 implemented according to the present invention will be described. First, however, the operation of the single diode-single MOSFET sub-circuits shall be first discussed.

Figure 3A:
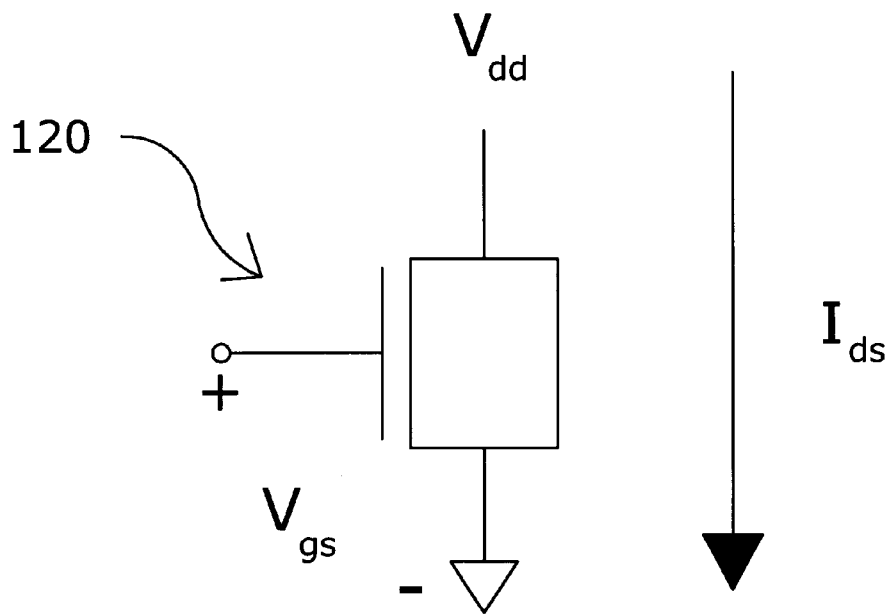
FIGS. 3A and 3B illustrate schematic diagrams of conventional MOSFET devices.
Figure 3B:
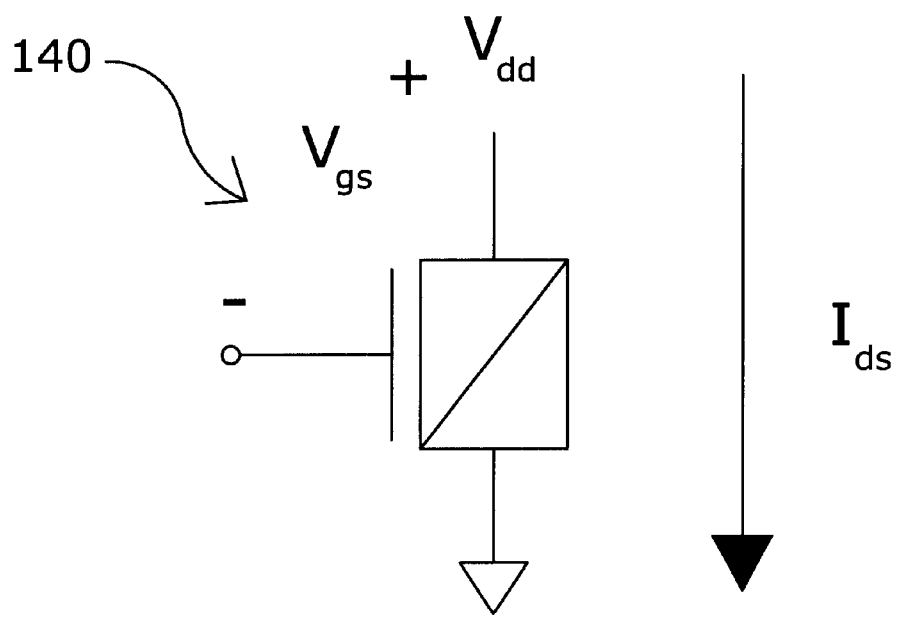
Figure 3C:
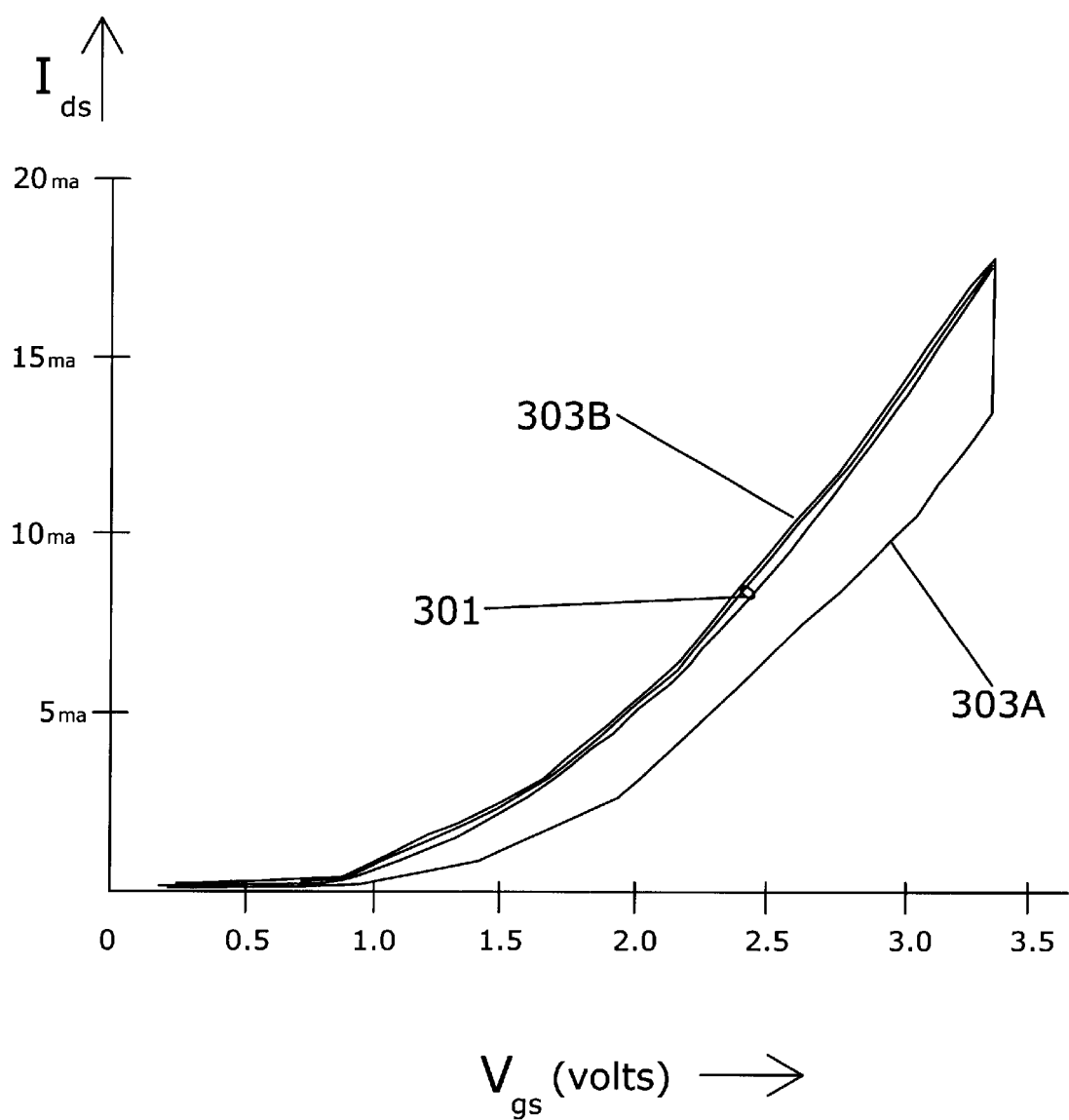
FIGS. 3C and 3D illustrate current vs. voltage characteristics for conventional MOSFET devices and MOSFET devices modified according to one embodiment of the present invention.
Figure 3D:
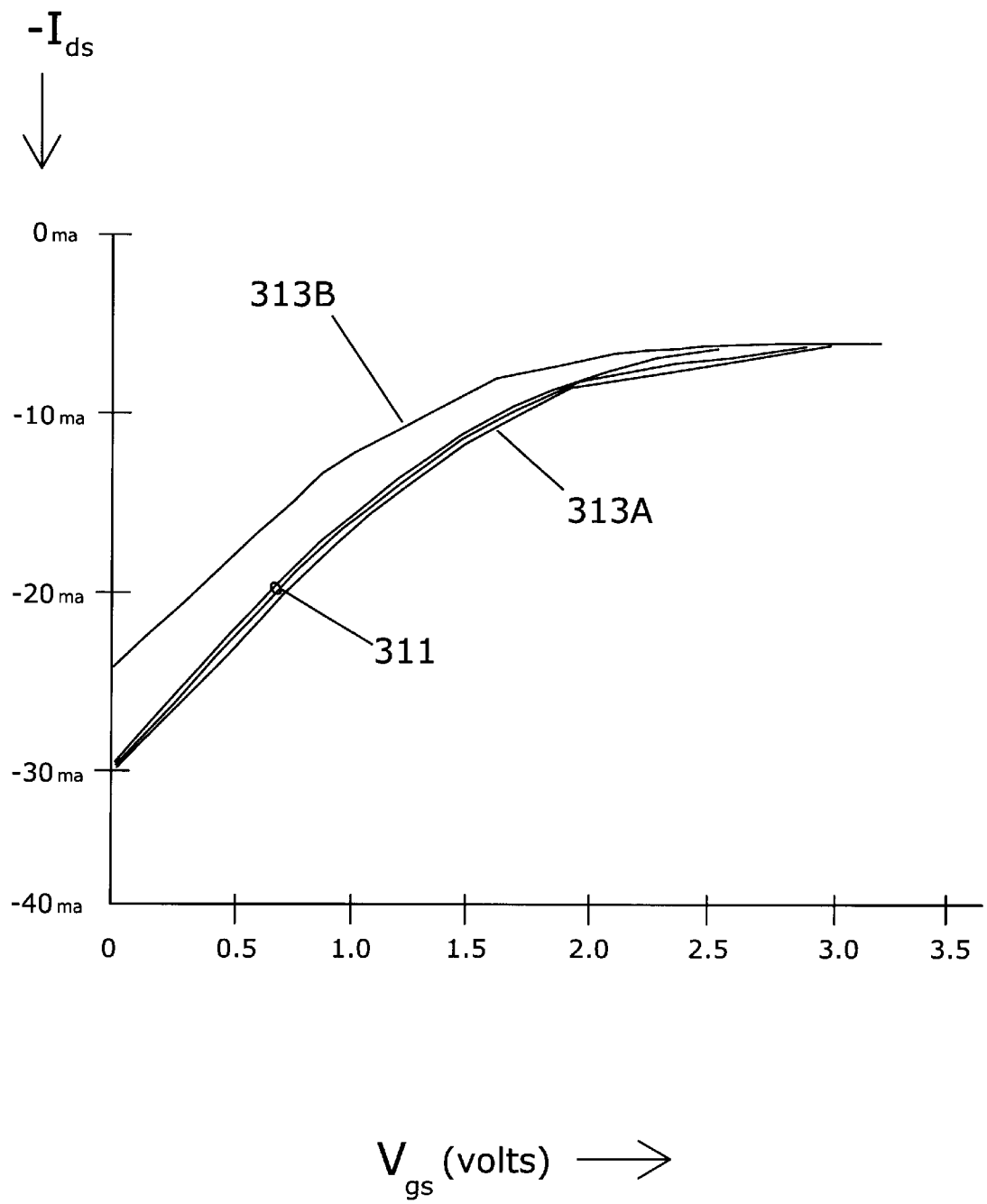

FIGS. 3A–F illustrate schematic diagrams of conventional and modified MOSFET devices as well as current ($I_{ds}$) vs. voltage ($V_{gs}$) characteristics (or I-V curves) for the conventional and modified MOSFET devices. For example, FIG. 3A illustrates a conventional N-MOSFET 120 arranged with its source/drain regions respectively coupled to voltage high ($V_{dd}$) and voltage low (e.g., ground) levels. FIG. 3B shows a conventional P-MOSFET 140 arranged with its source/drain regions respectively coupled to voltage low (e.g., ground) and voltage high ($V_{dd}$) levels. FIG. 3C illustrates a graph of a current, $I_{ds}$, flowing from one drain/source region to the other drain/source region of N-MOSFET 120 over a range of voltages, $V_{gs}$, applied between the gate and source regions of the N-MOSFET 120. FIG. 3D shows a graph of a current, $I_{ds}$, flowing from one drain/source region to the other drain/source region of P-MOSFET 140 over a range of voltages, $V_{gs}$, applied between the gate and source regions of the P-MOSFET 140. It is apparent from the I-V curves illustrated in FIGS. 3C and 3D that the conventional N-MOSFET 120 and conventional P-MOSFET 140 have substantially symmetric I-V curves 301 (FIG. 3C) and 311 (FIG. 3D) when rising and falling pulse edges are applied to the respective MOSFET gates 160, 180. A rising pulse edge is an electrical signal transitioning from a relatively low to a relatively high voltage level. A failing pulse edge is an electrical signal transitioning from a relatively high to a relatively low voltage.

Figure 3E:
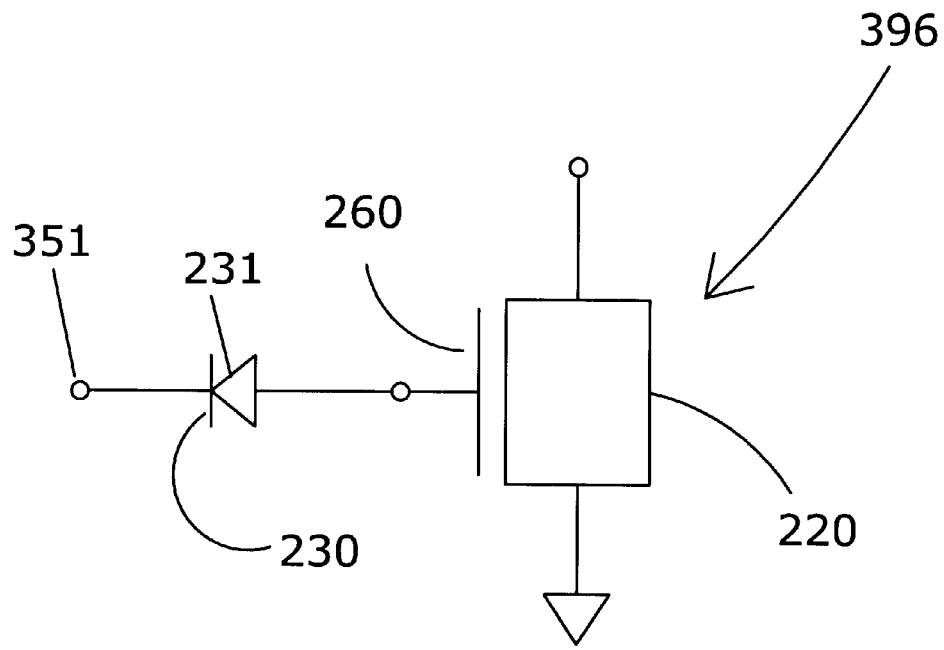
FIGS. 3E and 3F illustrate schematic diagrams of MOSFET devices modified according to one embodiment of the present invention.
Figure 3F:
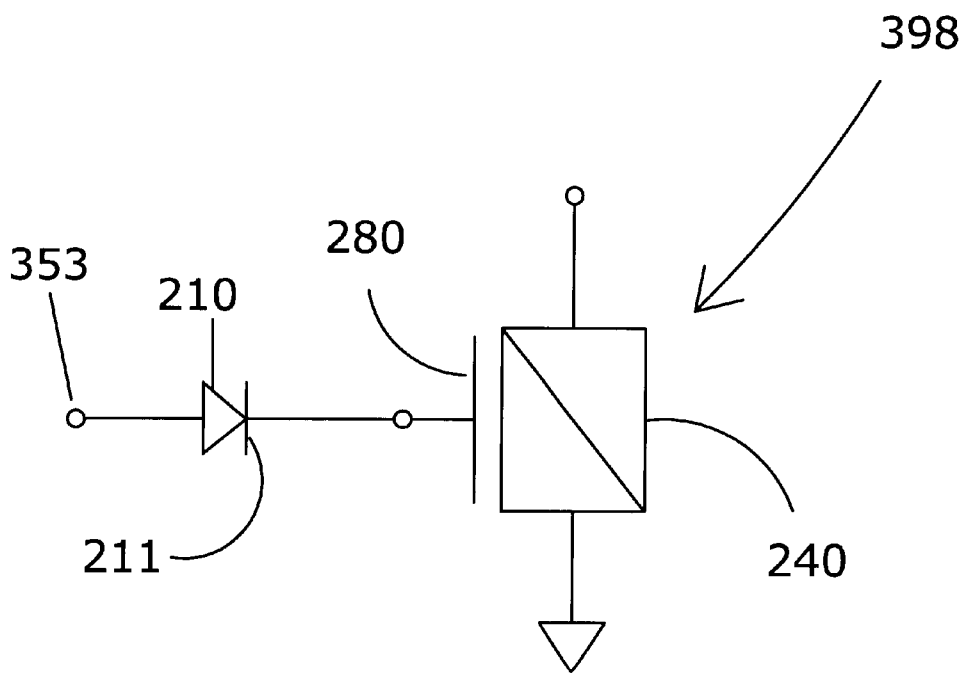

When a diode 210, 230 is placed in series with the gate of each MOSFET 240, 220, as illustrated in FIGS. 3E and 3F, hysteresis is introduced into the corresponding current vs. voltage characteristics of each circuit. FIGS. 3C and 3D illustrate such hysteresis in the I-V curves 303, 313 respectively associated with diode-N-MOSFET sub-circuit 396 and diode-P-MOSFET sub-circuits 398. I-V curves 303, 313 are also produced from rising and falling pulse edges applied to the respective uncoupled diode nodes 351, 353 (i.e., the diode nodes that are not coupled to the MOSFET gates 220, 240, and would be coupled together to form the input node 290 of the modified CMOS inverter 200).

The origin of the hysteresis of I-V curve 303 and 301 in FIG. 3C will now be described in view of the sub-circuit architecture and operation. As illustrated in FIG. 3E, diode-N-MOSFET sub-circuit 396 is formed when the diode anode 231 is coupled to the gate 260 of the N-MOSFET 220. As illustrated in FIG. 3F, diode-P-MOSFET sub-circuit 398 is formed when the diode cathode 211 is coupled to the gate 280 of the P-MOSFET 240.

The hysteresis of I-V curves 303A and 303B of FIG. 3C and 313A and 313B of FIG. 3D results from the asymmetry in the I-V curves 400 (illustrated in FIG. 4) of the diodes 210, 230. When forward biased, the diodes 210, 230 have a relatively low resistance 401, and, conversely, when reverse biased, the diodes 210, 230 have a relatively high resistance 403.

Figure 4:
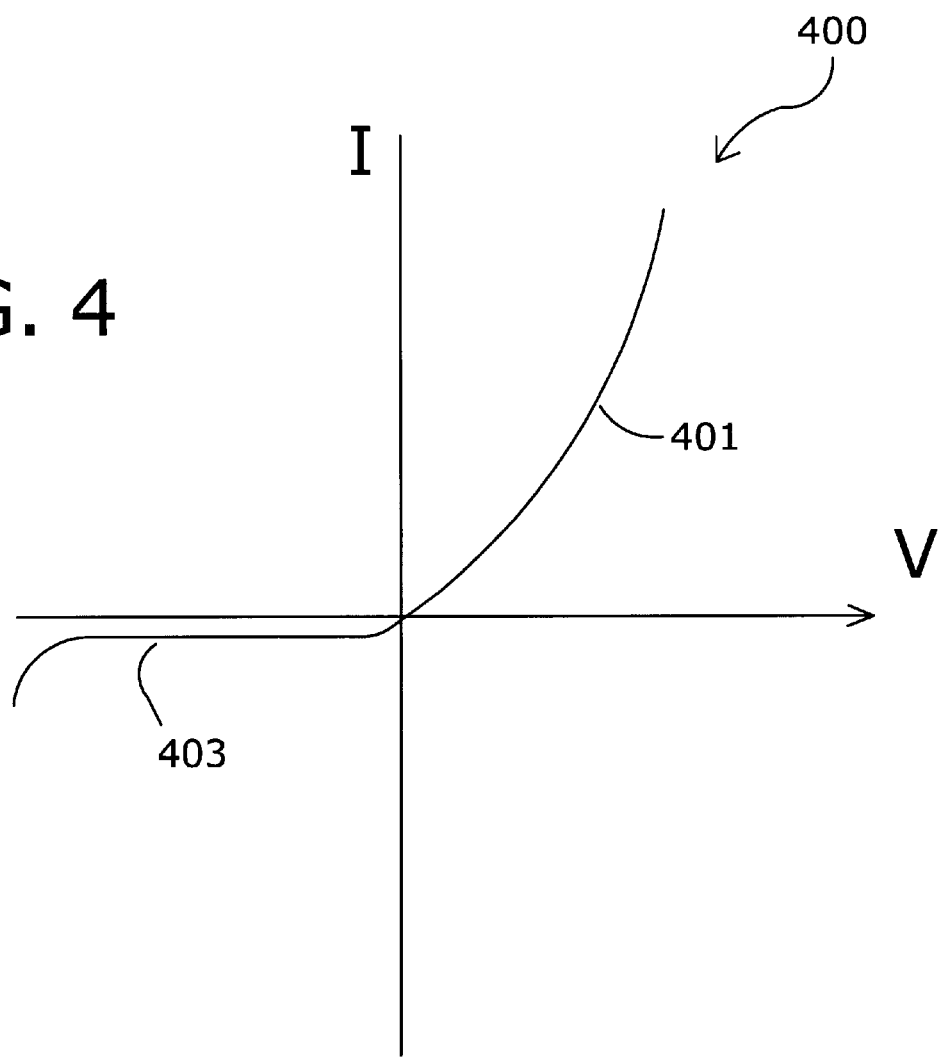
FIG. 4 graphically depicts the current-voltage characteristic of one embodiment of a diode to be used with the present invention.
Figure 5:
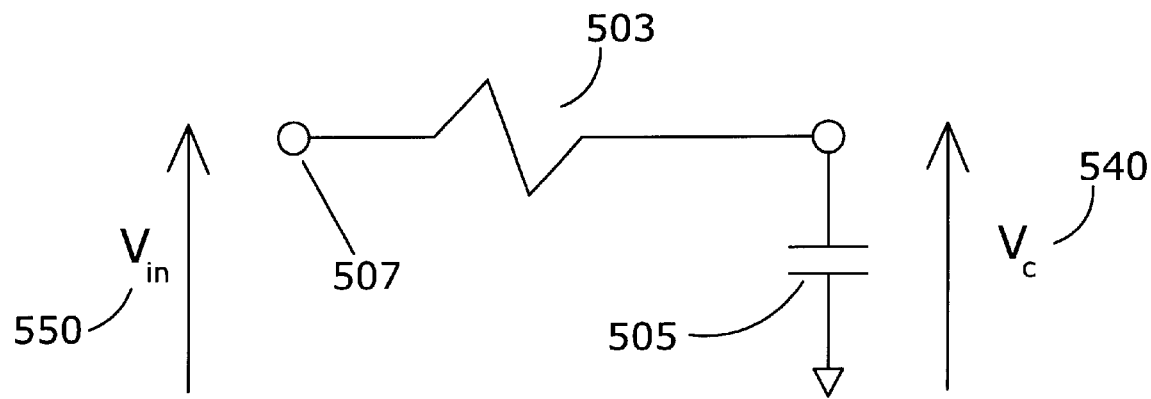
FIG. 5 depicts one embodiment of an electrical model of a diode serially coupled to a MOSFET gate.

As a result, the charging time-constant associated with the voltage applied to the MOSFET gates 260, 280 will vary depending upon the orientation of the diodes 210, 230 and the bias. In simplified form, the input portion of a diode 210, 230 serially coupled to a MOSFET gate 260, 280 may be electrically modeled as a resistor 503 coupled serially to a capacitor 505, as illustrated in FIG. 5. As is illustrated in FIG. 4, when the diode 210, 230 is reversed biased, the diode resistance is relatively large. Thus, when the diode 210, 230 is reverse-biased, the voltage ($V_c$) 540 across the gate capacitance 505, in FIG. 5, will change slowly relative to the level of input voltage ($V_{in}$) 550 applied to the uncoupled node 507.

As illustrated in FIG. 4, when the diode 210, 230 is forward biased, the diode resistance is relatively small. Thus, when the diode 210, 230 is forward biased, rather than reverse biased, the voltage ($V_c$) 540 across the gate capacitance 505 shown in FIG. 5 will more rapidly charge to the level of input voltage ($V_{in}$) 550 applied to the uncoupled node 507. Hence, the asymmetrical I-V characteristics of the diodes cause the hysteresis in the I-V characteristics of the diode-MOSFET sub-circuits 396, 398.

Figures 6A, 6B:
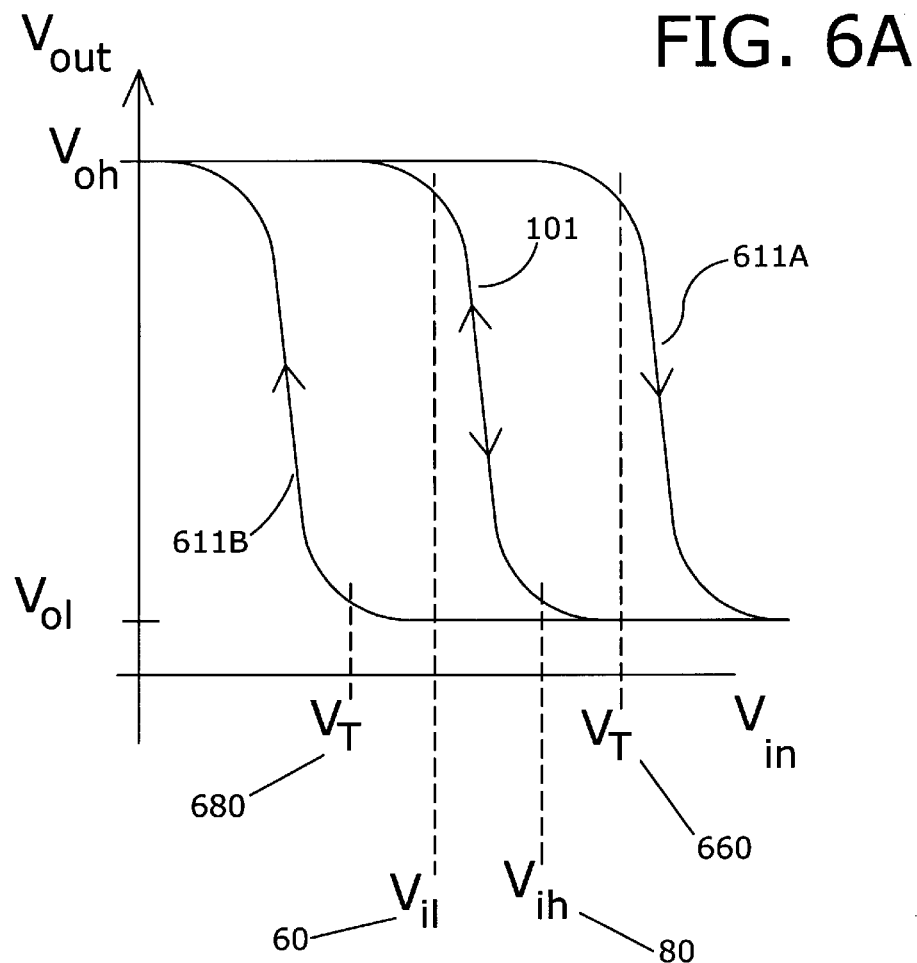
FIG. 6A depicts one embodiment of a voltage transfer characteristic (VTC) of a CMOS inverter according to one embodiment of the present invention.
FIG. 6B is a table illustrating approximate noise margins of a modified and conventional CMOS inverter.

When the diode-MOSFET sub-circuits 396, 398 are used to form the modified CMOS inverter 200 shown in FIGS. 2A–2C, the hysteresis of each of the subcircuits 396, 398 appears in the voltage transfer characteristic (VTC) 611 of the CMOS inverter 200 shown in FIG. 6A. The hysteresis in the VTC 611 provides enhanced noise tolerance and reduced short-circuit power dissipation as described below.

When a rising or falling pulse edge is applied to the input 290 of the modified CMOS inverter 200, one diode of the serially coupled diodes 210, 230 will have a relatively large resistance, while the other diode will have a relatively small resistance. As a result, the MOSFETS 220, 240 will switch assymetrically. The MOSFET coupled to the forward biased diode will switch between its ON-OFF states at a first input voltage level (e.g., substantially $V_{il}$ 60 or $V_{ih}$ 80). This MOSFET will switch states before the MOSFET coupled to the reverse biased diode switches between its OFF-ON states. When the MOSFET coupled to the reverse biased diode switches states, the voltage at the modified CMOS inverter output 270 also switches states. At this time, the pulse edge voltage level at the input 290 will have either risen above or fallen below the first input voltage level to a second input voltage level (e.g., VT+ 660 or VT– 680 further described below). Such asymmetrical switching of the MOSFETs 220, 240 creates the hysteresis in the VTC 611 of the modified CMOS inverter.

Because of the hysteresis of its VTC 611, the modified CMOS inverter 200 of FIG. 2A has larger noise margins than a conventional CMOS inverter 100. The modified CMOS inverter 200 of FIG. 2A also has lower short-circuit power dissipation than a conventional CMOS inverter 100. This is because, for each signal transition at the input of the modified CMOS inverter 200, the transistor transitioning from ON to OFF will transition faster than the transistor transitioning from OFF to ON. Therefore, the period of time during which both transistors in the modified CMOS inverter 200 are simultaneously ON during a signal transition may be reduced as compared to a conventional CMOS inverter 100.

The enhanced noise margins of the modified CMOS inverter 200 will now be described. As shown in FIG. 6A, the minimum input voltage recognized as a logic '1' is reduced from $V_{ih}$ 80 for the conventional CMOS inverter 100 to VT− 680 for the modified CMOS inverter 200. Correspondingly, the maximum input voltage recognized as logic '0' is increased from $V_{il}$ 60 for the conventional CMOS inverter 100 to VT+ 660 for the modified CMOS inverter 200. Such voltage shifts occur for CMOS inverters 100, 200 having similar transistor aspect ratios (i.e., width-to-length ratios).

As a result, the noise margins for the modified CMOS inverter 200 are increased in comparison to a conventional CMOS inverter 100. The approximate noise margins of the modified and conventional CMOS inverter are shown in the table of FIG. 6B.

Because $V_{ih}$>VT−, then by definition the noise margin of the modified CMOS inverter 200, $NM_H$(MD), is greater than the noise margin of the conventional CMOS inverter 100 $NM_H$(CD), at the logic high voltage level. Similarly, because $V_{il}$<VT+, then by definition the noise margin of the modified CMOS inverter 200, $NM_L$(MD), is greater than the noise margin of the conventional CMOS inverter 100, $NM_L$(CD), at the logic low voltage level. As used above and in FIG. 6B, "CD" means conventional design and "MD" means modified design. Clearly, the modified CMOS inverter 200 will have larger noise margins than its conventional CMOS inverter 100 counterpart when both inverters 100, 200 are (1) formed by transistors of the same dimensions and (2) are operated under identical conditions (e.g., the same power supply voltage, temperature, etc.).

The modified CMOS inverter 200 of FIG. 2A dissipates less short-circuit power than the conventional CMOS inverter 100. This is because during switching, both the N-MOSFET 220 and P-MOSFET 240 in the modified CMOS inverter 200 are simultaneously turned ON, or partially ON, for a reduced period of time as compared to a conventional CMOS inverter. The period of time that both MOSFETs 220, 240 are simultaneously conductive (e.g., turned ON) is substantially reduced in the modified CMOS inverter 200 because the MOSFETs 220, 240 are asymmetrically switched. Prior to one MOSFET being switched from its non-conductive to its conductive state (e.g., turned from OFF to ON), the other MOSFET has begun to be, or has already been, switched from its conductive to its non-conductive state. In other words, the MOSFET that is initially turned ON prior to a logic state transition, turns OFF faster than the MOSFET that is turned initially turned OFF, turns ON. As a result, the conduction period of the modified CMOS inverter 200 is substantially reduced or even eliminated, and the short-circuit power dissipation is diminished in comparison to the conventional CMOS inverter 100.

Because of its asymmetric switching, the modified CMOS inverter 200 has a relatively slower switching speed, in comparison to the conventional CMOS inverter 100, when presented with an input signal having a relatively short transition period between logic state voltages. The switching speed of the modified CMOS inverter 200 may be reduced by modifying the diode characteristics (e.g., with a parallel resistance, adjustment of polycrystalline grain size, and/or adjustment of diode dimensions or dopant concentrations).

Further, the switching speed of the modified CMOS inverter 200 may, in fact, be negligible in comparison with the input signal slew rate. At fast switching speeds of state-of-the-art circuitry, circuit switching speed is limited by the input signal slew rates resulting from parasitic circuit elements including the capacitance of transmission lines and transistors (e.g., input and load capacitances).

The additional delay of the modified CMOS inverter 200 extends a single switching cycle by a slight amount corresponding to the voltage slew time difference between the conventional and altered switching thresholds. However, the modified CMOS inverter 200 dissipates an order of magnitude less short-circuit power than the conventional CMOS inverter 100. Therefore, the switching speeds of circuitry including the modified CMOS inverter 200 are substantially faster than circuitry having similar noise margins, power consumption, and size that do not include the modified CMOS inverter 200.

The novel device designs can be used throughout the complete design range of logic circuits and particularly the design of logic circuits to be operated in noisy environments. In that way, each logic gate, regardless of logic function, will have enhanced noise margins providing greater assurance that the information will not be corrupted by noise. In doing so, power consumption/dissipation will be reduced and the circuits can be formed in reduced chip space. The novel device designs can thus be used throughout the complete design of logic circuits and particularly logic circuits that must operate with stringent low power requirements. The resulting logic gates will have lower short-circuit (direct-path) power dissipation compared to their conventionally designed counterparts in the same manner as the modified CMOS inverter 200 discussed above. Switching power may also be reduced to some degree by junction capacitance of the diode in series with the transistor gate capacitance.

Specific logic gate or macro designs within a larger digital integrated circuit or system design can employ the novel CMOS device throughout the design (e.g., of a logic macro, a microprocessor and/or memory device, or in any portions of the design where particular attention to noise immunity and/or reduced power dissipation is warranted). Such a logic macro, microprocessor, or memory may have a sub-portion thereof, such as a memory driver, decoder, cache, translation table, logic macro, arithmetic processor, gate array, or any other digital processing functional circuitry. The implementation of the invention does not require any alteration of the architecture of these more complex devices or device groupings as now known in the art and can similarly be employed in any architectures of such devices that may hereafter be developed, particularly in view of the increased performance, noise immunity, integration density, and reduced transistor count provided by the invention.

For example, using the devices of the present invention in the design of Off Chip Receiver (OCR) circuits will ensure that all applied input signal waveforms will be conditioned and outputted by the receiver circuit as sharp, square digital signals to the rest of the digital circuit. In this way, a simple two-transistor inverter circuit built with the novel device designs can perform the task of a Schmitt trigger circuit using far fewer devices. As another example, using the devices of the present invention in the design of specific large, powered-up circuits, such as Off Chip Drivers (OCD), to reduce overall system power is of great value. In this way, the short-circuit power dissipation of these circuits designed with devices with large aspect ratios is significantly reduced, thus significantly reducing the total power dissipated by the overall digital system. The devices of the present invention can be used in inverter gate circuits and other multiple-input logic gate configurations to combine digital logic resolution with all of the features found in Schmitt trigger circuits. The effect will be denser and more functional circuit designs since far fewer transistors would be required when the novel device designs are used in developing respective functions. OCR and OCD circuits according to the present invention may be included in devices which communicate through the OCR and OCD with a separate electronic system or systems.

Figure 10A:
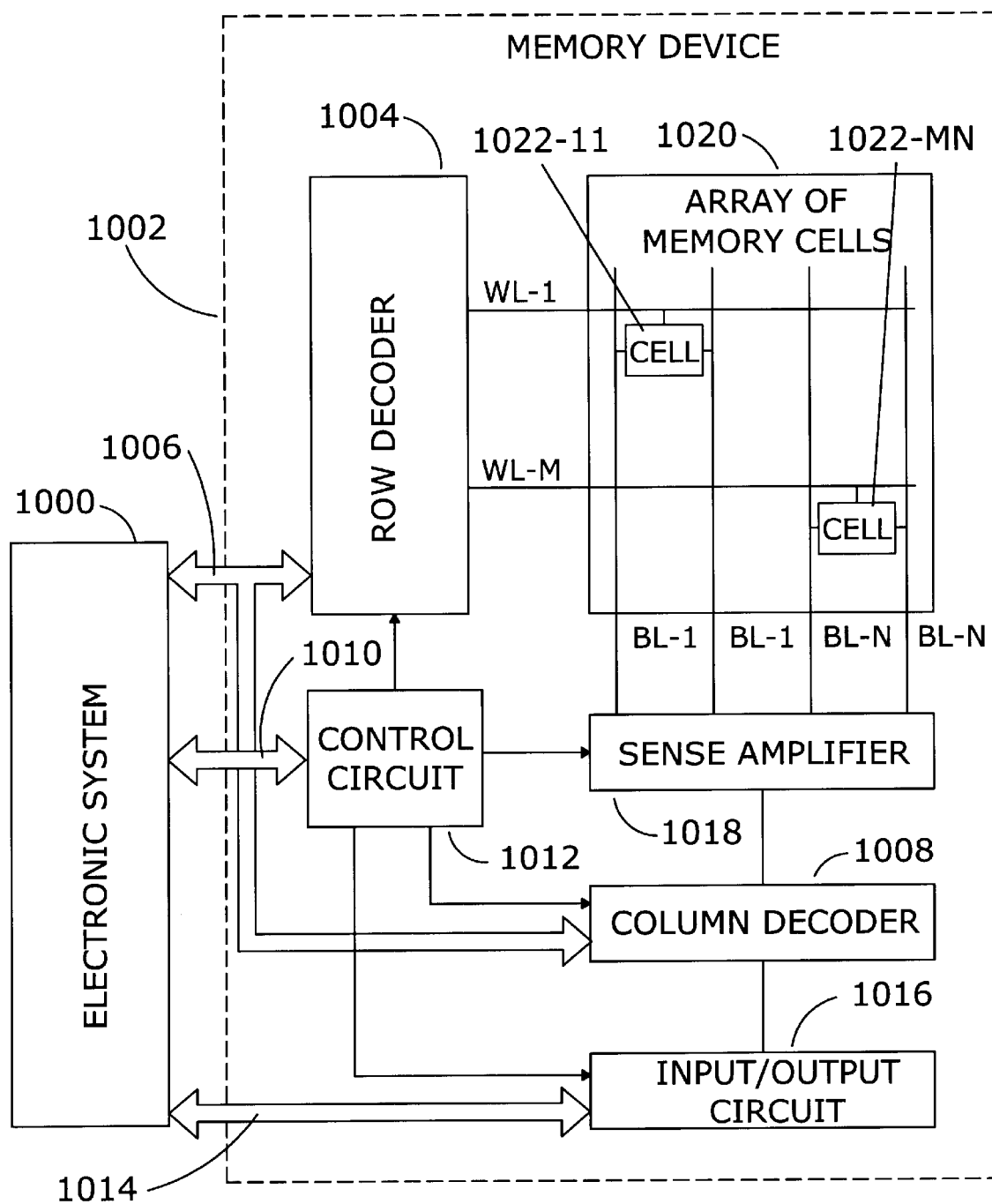
FIG. 10A is an embodiment of the invention in which circuits according to the present invention are embodied in a memory having an interface to an electronic system.

A further example of an implementation of the novel devices in a system is shown in FIG. 10A. As shown in FIG. 10A, electronic system 1000 is coupled to memory device 1002. The electronic system 1000 can include (not shown), for example, a microprocessor, a memory controller, a chip set or other appropriate system that stores data in a memory device. The electronic system 1000 is coupled to a row decoder 1004 of the memory device 1002 through address bus 1006. The address lines bus 1006 also couples the electronic system 1000 to a column decoder 1008. Control lines 1010 couple the electronic system 1000 to a control circuit 1012. Finally, input/output (I/O) lines 1014 couple the electronic system 1000 to an input/output circuit 1016.

The memory device 1002 further includes sense amplifier 1018 and an array of memory cells 1020. Array of memory cells 1020 includes a number of word lines, WL-1 through WL-M and a number of bit lines, BL-1 through BL-N. To this end, bit lines BL-1 through BL-N are coupled in complementary pairs (referred to as "bit line pairs") to sense amplifier 1018. Further, word lines WL-1 through WL-M are coupled to row decoder 1004. Memory device 1002 is controlled by the control circuit 1012. Control circuit 1012 is coupled to row decoder 1004, sense amplifier 1008, column decoder 1008, and input/output circuit 1016. Array of memory cells 1020 includes a number of memory cells 1022-11 . . . 1022-MN. Memory cell 1022-11 may, as an example, be a static, dynamic, read only, electronically erasable read only memory cell, or any other type of memory cell.

In operation, memory device 1002 reads and writes data for electronic system 1000. For example, to read the value from memory cell 1022-11, electronic system 1000 provides the address of memory cell 1022-11 to row decoder 1004 over address lines 1006. Electronic system 1000 also provides control signals to control circuit 1012 over control lines 1010. Control circuit 1012 provides signals to sense amplifier 1018 which senses differential voltages or currents on bit line pairs.

Row decoder 1004 selectively drives word line WL-1 to a high logic level to activate a row of memory cells. Column decoder 1008 receives the column address of the selected cell from electronic system 1000. Column decoder 1008 identifies the appropriate bit line pair for sense amplifier 1018 to use in reading the value from memory cell 1022-11. Sense amplifier 1018 senses and amplifies the difference in voltage in the bit line pair and thus produces high and low logic levels on complementary nodes of sense amplifier 1018 that correspond to the sensed bit line pair. These voltage levels are passed to electronic system 1000 through input/output circuit 1016 over input/output lines 1014.

In a write operation, electronic system 1000 provides data to be written to, for example, memory cell 1022-11 over input/output lines 1014 to input/output circuit 1016. Row decoder 1004 receives the row address from the electronic system 1000 over address lines 1006 to select the appropriate word line for activation. Column decoder 1008 receives the column address from electronic system 1000 over address lines 1006 to select the appropriate bit line pair for the selected memory cell. Sense amplifier 1018, under the control of control circuit 1012, forces, via cell write circuitry, the bit line pair for memory cell 1022-11 to complementary high and low logic levels based on the data to be stored in memory cell 1022-11. Row decoder 1004 receives an address from electronic system 1000 over address line 1006 that indicates the appropriate word line to activate for this storage operation. When word line WL-1 is activated, the data on bit line BL-1 pair is stored in the memory cell corresponding to the active word line and active bit line pair. In this process, the high and low logic levels for sense amplifier 1018 are translated to appropriate voltage levels for memory cell 1022-11.

The devices according to the present invention may be implemented in any of the blocks 1000–1022 of the system depicted in FIG. 10A. For example, the devices of the present invention may be incorporated partially or completely into the memory array as a four transistor (4T) static random access memory (SRAM) cell or six transistor (6T) static random access memory (SRAM) cell.

Figure 10B:
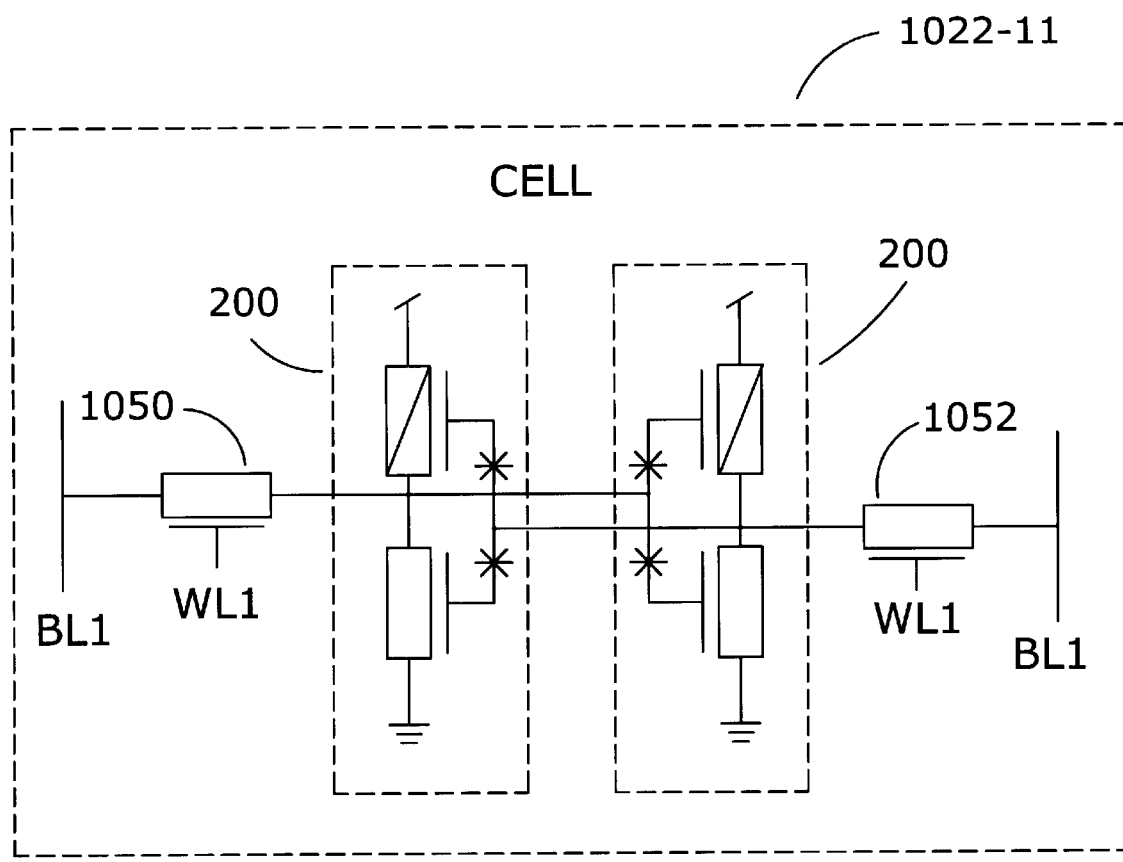
FIG. 10B is an embodiment of a memory cell incorporating devices according to the present invention.

An embodiment of a static random access memory cell 1022-11 incorporating the present invention is depicted in FIG. 10B. The memory cell 1022-11 includes two inverters 200 incorporating the present invention (shown in FIG. 2C) that are cross coupled. The gate of each cross coupled inverter 200 is then coupled to a source/drain region of one of two pass gate transistors 1050 and 1052. The pass gate transistors 1050 and 1052 each have their gates coupled to one of the word lines, in this case WL-1, and the other source/drain region coupled to one of the complementary bit line pairs BL-1. Upon activating the word line WL-1, data on the bit lines may be written into the cell, or data stored in the cell may be read out onto the bit lines. In both operations, current flows across the pass gate transistors 1050 and 1052 between the bit line pairs BL-1 and the cross-coupled gates of the inverters 200. The incorporation of the devices of the present invention into the memory cell may reduce static power consumed by the memory device 1002. The novel devices may be implemented in off-chip driver (OCD) or off-chip receiver (OCR) circuits, for example, that interface with the electronic system 1000, functionally shown as included within the row decoder 1004, control circuit 1012, column decoder 1008, and input/output circuit 1016. OCR and OCD circuits designed with the devices of the present invention may have a number of advantages pertinent to the system of FIG. 10A. For example, an OCR designed with the devices of the present invention may dissipate less static power and have better noise margins than a conventional OCR and comparable or better noise margins than an OCR including a Schmidt trigger. Robust noise margins are particularly important for OCRs on memory chips because of a significant amount of noise on signal and power lines that is occasioned by memory and memory interface operations. Such operations include cyclically pre-charging the highly capacitive memory array 1020 and receiving a large number of data/ address signals transitioning simultaneously. OCDs may benefit from the novel devices because of reduced power dissipation and reduced slew rate compared to conventional OCDs. OCD power dissipation is likely to be reduced over conventional designs, for example, because the time during which opposing push-pull transistors are simultaneously in the ON state during a signal transition is reduced according to the present invention. The slew rate reduction in an OCD incorporating the devices of the present invention may be optimized by selecting appropriate sizes of output transistors and diode characteristics and is advantageous as it reduces problematic ringing on the output of the OCD. The slew rate reduction sought to be exploited is a function of turn-ON time of the novel devices as compared with conventional devices. The novel devices may also be incorporated as simple or complex logic gates in any circuits of the other units 1000–1022 of the memory device 1002. A simple implementation of both and OCR and OCD according to the present invention is the inverter 200 of FIGS. 2A–2C.

Figure 11:
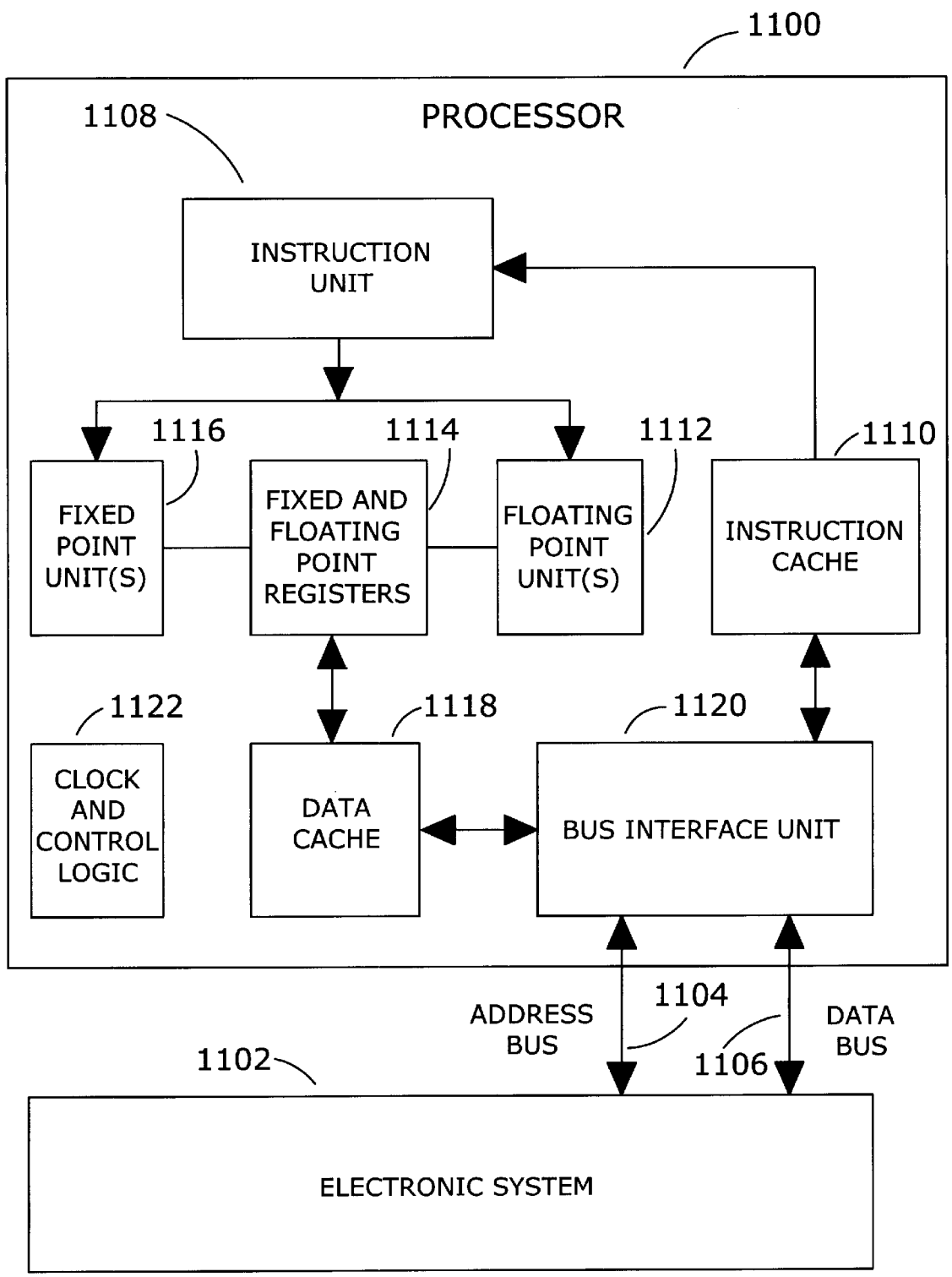
FIG. 11 is an embodiment of the invention in which circuits according to the present invention are embodied in a processor having an interface to an electronic system.

Still another implementation of the novel devices is in a system as shown in FIG. 11. As shown in FIG. 11, an illustrative processor 1100 is coupled to an electronic system 1102 via an address bus 1104 and a data bus 1106. The processor 1100 may be a digital microprocessor or may be a digital signal processor. The processor 1100 includes an instruction unit 1108, at least one fixed point unit 1114, at least one floating point unit 1112, fixed point and floating point registers 1116, data and instruction caches 1118 and 1110 and a bus interface unit 1120.

The bus interface unit 1120 is coupled to the instruction cache 1110 and the data cache 1118 and writes data from the processor 1100 onto the electronic system 1102 via the address bus 1104 and data bus 1106. The bus interface unit 1120 also reads data from the electronic system 1102 via the address bus 1104 and data bus 1106. Program instructions read from the electronic system for execution by the processor 1100 are stored into the instruction cache 1110. Data read from the electronic system 1102 are written into the data cache 1118. The instruction unit 1108 is coupled to the instruction cache 1110. The instruction unit 1108 includes logic for fetching program instructions from the instruction cache 1110 and from the electronic system via the bus interface unit 1120 when the instruction to be fetched is not stored in the instruction cache 1110. Typically, the instruction unit 1108 fetches instructions from sequential memory addresses. However, the instruction unit 1108 may include a branch prediction unit which predicts program branches and fetches instructions beginning at an instruction associated with a predicted branch. Typically, fetched instructions are temporarily stored in an instruction queue of the instruction unit 1108 for dispatch and execution by execution units of the processor 1100.

The instruction unit 1108 is coupled to execution units for executing instructions in the instruction queue. As shown in FIG. 11, there are illustrated fixed point unit(s) 1114 and floating point unit(s) 1112, each of which is an illustrative example of an execution unit. There may be one or more execution units and instruction units. The instruction unit 1108 dispatches instructions to the execution units for execution. Instructions may be dispatched in parallel, such that more than one program instruction undergoes execution in different execution units during the same processor clock cycle.

The fixed and floating point registers 1114 are coupled to the execution units. The fixed and floating point registers 1114 temporarily store operands referenced by program instructions and the results of instruction execution for use by other instructions. The values stored in the fixed and floating point registers 1114 may come from the data cache 1118, the instructions, or from the results of instruction execution. Values of the fixed and floating point registers 1114 may be stored in the data cache 1118 and written to the electronic system 1102 via the bus interface unit 1120.

The data cache 1118 stores data read from the electronic system 1102 as well as data produced during execution of program instructions by the execution units. The clock and control logic 1122 is used to maintain and recover the processor state as well as to issue clock signals to all of the units of the processor 1100.

The devices according to the present invention may be used in implementing any of the logic found within units 1108–1122 of the processor 1100. In this implementation, the novel devices may reduce static power consumed by processors using traditional circuits. The devices of the present invention may be used in the bus interface unit 1120 to implement OCR and OCD devices to achieve the same advantages described above with reference to the memory device. The devices of the present invention may be used in the cache memories 1110 and 1118 as well as the registers 1116 to implement memory or registers cells having less static power, or to implement row and column decoding functions with enhanced noise immunity.

In view of the foregoing, it is seen that the invention provides a new class of logic devices and circuits with lower power dissipation and higher noise immunity. The CMOS device designs herein preferably include a polysilicon diode that is oriented as discussed above or other non-linear, asymmetric conduction circuit at the gate of each p-channel MOSFET and each n-channel MOSFET in the CMOS circuit design.

There are many advantages and exemplary applications of the present invention. For example, logic gates employing the novel device designs will have higher noise immunity and lower power dissipation. Moreover, the specific I-V characteristic of the polysilicon diodes is not critical to the objective of achieving larger noise margins and lower power dissipation in resulting logic gate design using the novel devices.

All of the features of a conventional Schmitt trigger circuit are automatically included in the design of logic gates employing device designs according to the present invention.

The device designs disclosed herein generally require no greater chip area per device than conventional dual work function polysilicon device designs, since the diode at the gate of each transistor is not itself a separate circuit element but is instead imbedded in the gate electrode polysilicon material by taking advantage of the selective polysilicon doping and selective silicide processes of advanced CMOS technologies with dual work function polysilicon gates. Thus, the novel device designs are easily implemented in any advanced CMOS technology without significantly increasing process complexity and without decreasing circuit density. In fact, for some circuit designs the circuit density may be improved when the novel devices are used instead of conventional devices.

The novel device designs can be used in all CMOS technologies, either bulk or SOI, operating in any environment, all $V_{dd}$ levels and all temperatures.

The novel transistors of the invention and all of the circuit features that their use enables, provide numerous significant advantages not previously realized with fewer trade-offs and less compromise of performance in any circuit implementation in any CMOS technology.

All CMOS logic gates and circuits (e.g., INVERTER, NOR, NAND, XOR, etc. and any arbitrary combinations thereof) can be designed with the novel CMOS device designs without restriction.

A method of designing and making the novel transistors in a semiconductor according to one embodiment of the invention will now be described.

Figure 7:
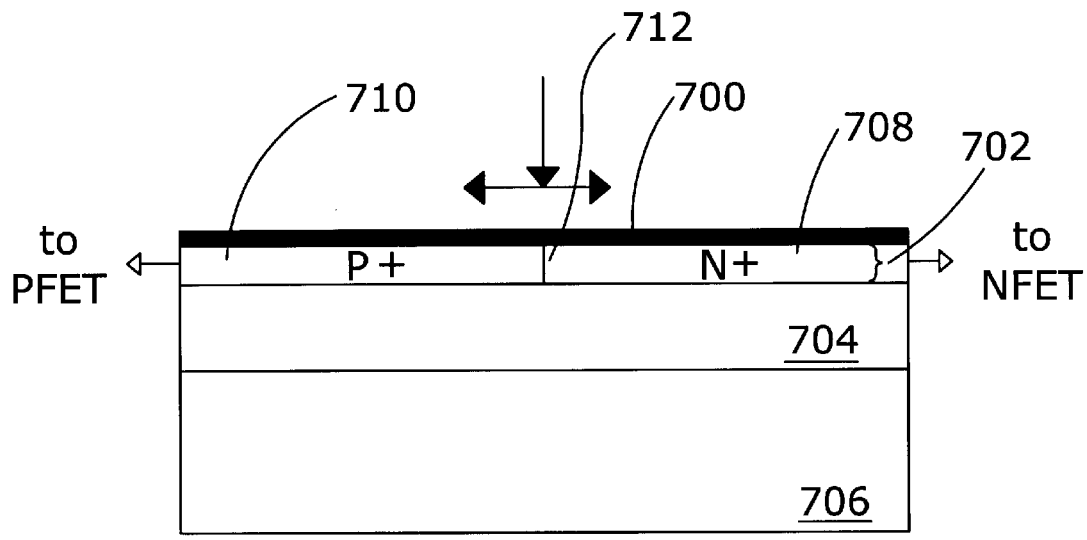
FIG. 7 is an illustration of a cross-sectional view of one embodiment of dual-work function polysilicon.

FIG. 7 depicts a cross-sectional view of a semiconductor. Specifically, a cross-sectional view through a silicide layer 700, polysilicon layer 702, a field oxide layer 704 and a silicon substrate layer 706 in a region without transistors is shown. The polysilicon layer 702 and the silicide layer 700 are each electrically conductive and are used for wiring and to form gate regions of N-MOSFET and P-MOSFET transistors as indicated by the arrows on opposing ends of the polysilicon layer 702. The polysilicon layer 702 and silicide layer 700 carry current between wiring-regions and regions where N-MOSFET and P-MOSFET transistors are formed.

As shown in FIG. 7, it is apparent that the polysilicon layer 702 includes a N+ region 708 and a P+ region 710 and a PN junction 712 therebetween. Polysilicon with one N+ and one P+ region, as shown in FIG. 7, is known as dual work function polysilicon. With the continuing emphasis on high-performance, high integration density, low-power integrated digital logic circuits, advanced CMOS technologies now commonly use dual work function polysilicon as illustrated in FIG. 7. (However, it is to be understood that no portion of FIG. 7 is admitted to be prior art in regard to the invention since it is highly schematic and arranged principally to facilitate an understanding of the invention by contrast therewith; accordingly, FIG. 7 is labeled "Related Art".) The N+ region 708 and P+ region 710 are formed as a result of ion implantation into the polysilicon layer 702 during formation of the N+ and P+ diffusions that form the source and drain regions of transistors in the silicon substrate. In this regard, there are innumerable process variations that may be used to fabricate devices according to the present invention. An example of a silicon process follows. In general, the process includes depositing undoped polysilicon over a semiconductor substrate and patterning and etching the polysilicon over underlying features including, for example, transistor and/or other device regions, wiring regions, and thin and thick oxide regions. The patterning and etching of the polysilicon forms polysilicon portion of devices, such as transistor gates, and polysilicon interconnects. After the polysilicon is patterned, N+ and P+ ion implantation steps are performed one at a time with an annealing step performed subsequent to the implantation step. Typically, these steps include forming oxide and photoresist masking layers followed by patterning and exposing masking regions to receive n-type or p-type doping, the dopant type dependent on which step is being performed. The n-type or p-type implant is generally made through the exposed regions in the masking layers. As an illustrative example, the n-type implant parameters may be: approximately $10^{15}$ arsenic ions/cm$^2$ at 50 KeV; the p-type implant parameters may be: approximately $2 \times 10^{15}$ BF$_2$ ions/cm$^2$ at 50 KeV. After each implant, the masking layers are stripped and an annealing step is performed illustratively at 900 degrees Celsius for 15 minutes.

After the polysilicon is patterned and doped as described above, a silicide layer is selectively formed on the polysilicon and other desired areas of the semiconductor, such as source and drain regions. Silicide formation may be effected by forming oxide and photoresist masking layers to selectively expose and block portions of the polysilicon and other regions of the semiconductor. The photoresist may then be stripped, followed by depositing a layer of titanium. The titanium is then annealed to form a silicide layer onto selective portions of the polysilicon layer.

The silicide layer increases the electrical conductivity of the underlying polysilicon and the source/drain regions.

As a result of ion implantation, the polysilicon layer 702 has a N+ doping over N-MOSFET devices. Similarly, the polysilicon layer 702 has a P+ doping over P-MOSFET devices. In the wiring region between N and P MOSFETS, the polysilicon layer 702 has a single boundary between adjoining regions that are exposed to one of N type or P type doping. Therefore, conventionally, one PN junction 712 is formed between adjoining N and P-MOSFET devices as shown in FIG. 7.

In order to avoid rectification at the PN junction 712, conventionally, the silicide layer 700 is formed over the polysilicon layer 702. The silicide layer 700 is typically formed by depositing a metal, such as titanium or tungsten, onto the polysilicon layer 702. Subsequently, the metal coating is annealed to form a layer of conductive metal-silicon (silicide) compound. Current flows between each of the regions 708 and 710 of the polysilicon layer 702 and the silicide layer 700 thus effectively short-circuiting the PN junction 712 and eliminating the effects of the PN junction on current carried along the layer 700 and the underlying layer 702. Thus, the PN junction 712 of FIG. 7 is viewed as undesirable and conventionally the silicide layer 700 is formed over the dual work function polysilicon to functionally negate the PN junction 712.

According to the present invention, a plurality of appropriately positioned PN junctions within the polysilicon layer 702 are desirable and indeed are used to form the modified devices according to the present invention.

Figure 8A:
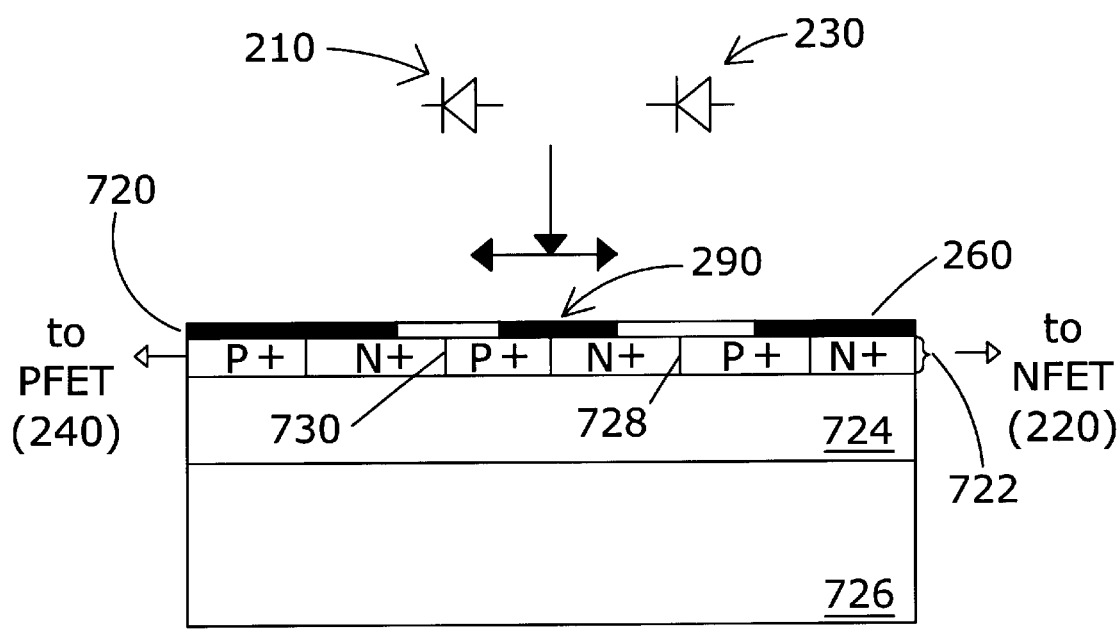
FIGS. 8A–8D are plan and cross-sectional views of a semiconductor according to the present invention.

As shown in FIG. 8A, a cross-section is illustrated of a semiconductor region between N-MOSFET and P-MOSFET devices implementing, for example, an inverter 200 according to the present invention. As shown in FIG. 8A, the semiconductor includes a silicide layer 720, a polysilicon layer 722, a field oxide layer 724 and a silicon substrate 726. It is apparent that a plurality of N+ and P+ regions with corresponding PN junctions are formed in the polysilicon layer 722. Moreover, it is apparent that PN junctions 728 and 730 are not strapped with a silicide layer 720 as in the case of FIG. 7. Therefore, unlike the layers 700 and 702 illustrated in FIG. 7, the layers 720 and 722 of FIG. 8A necessarily carry current across one or both PN junctions 728 and 730 when supplying current between a wiring region and the N-MOSFET and P-MOSFET devices.

The wiring region may be disposed in any convenient spatial relationship relative to the N-MOSFET and P-MOSFET transistors and the gate regions thereof, including between, above, or adjacent to the N-MOSFET and P-MOSFET devices as long as structures in the wiring region do not interfere with the proper operation of the N-MOSFET and P-MOSFET devices. As such, the wiring region is outside of the gate region of the N-MOSFET and P-MOSFET devices, where outside is taken to mean any convenient spatial relationship that avoids interference with the devices as discussed above.

The plurality of alternating N+ and P+ regions of the polysilicon layer 722 are deliberately formed according-to the present invention to create and exploit the PN junctions 728 and 730 in the polysilicon layer 722. The PN junctions 728 and 730 correspond to the diodes 230 and 210 shown in FIG. 2A that respectively couple an input signal from a terminal 290 to gate regions 280, 260 of the P-MOSFET 240 and N-MOSFET 220 according to the present invention. The terminal 290, shown in both FIGS. 2A and 8A, includes the silicide layer 720 strapping N+ and P+ regions between one of the PN junctions as shown. The layers 720 and 722 are shown extending to the gate regions of devices 220 and 240 at opposing ends of the depicted cross-section.

As illustrated in FIG. 8A, the doping of the polysilicon layer 722 in accordance with the invention follows a pattern of alternating N+ and P+ regions, some of which are selectively strapped together (e.g., short-circuited) in the manner of the dual work function CMOS structure of FIG. 7, preferably by a patterned silicide or metal (such as titanium or tungsten). However, selected junctions 728 and 730 are exposed to form diodes 230 and 210, respectively. Techniques for patterning silicides or metal to expose P-type contiguous and N-type doped regions suitable for the practice of the invention are well-known to those skilled in the art.

Figure 8B:
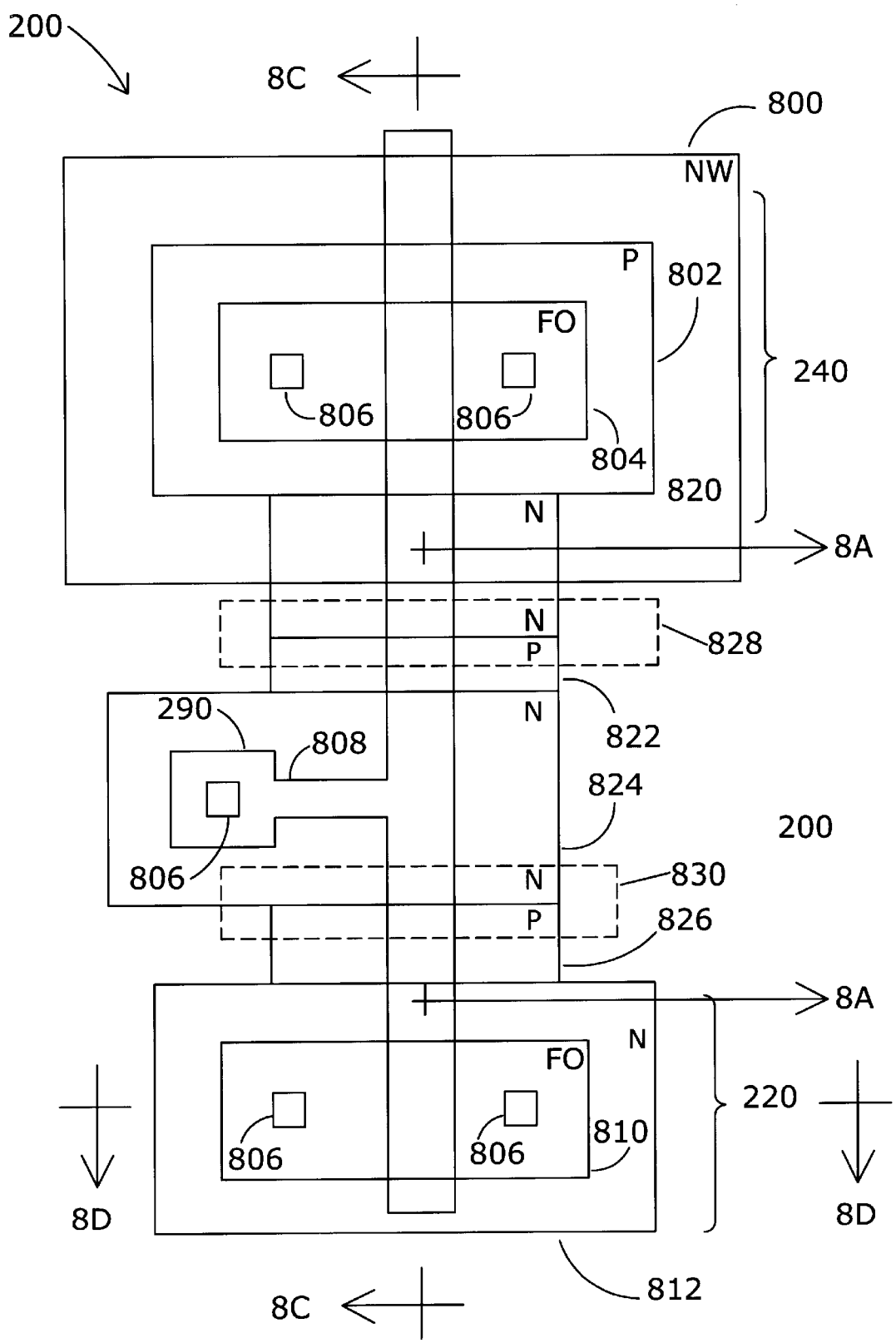
Figure 8C:
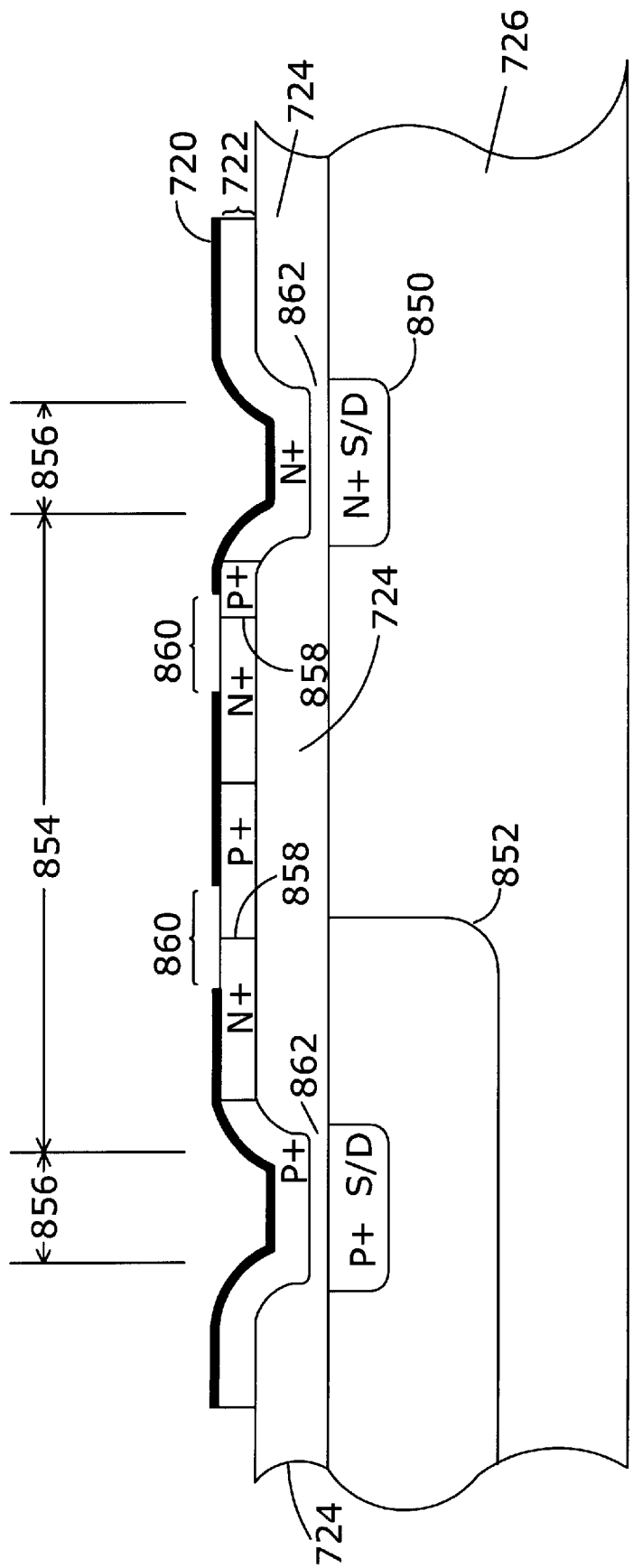
Figure 8D:
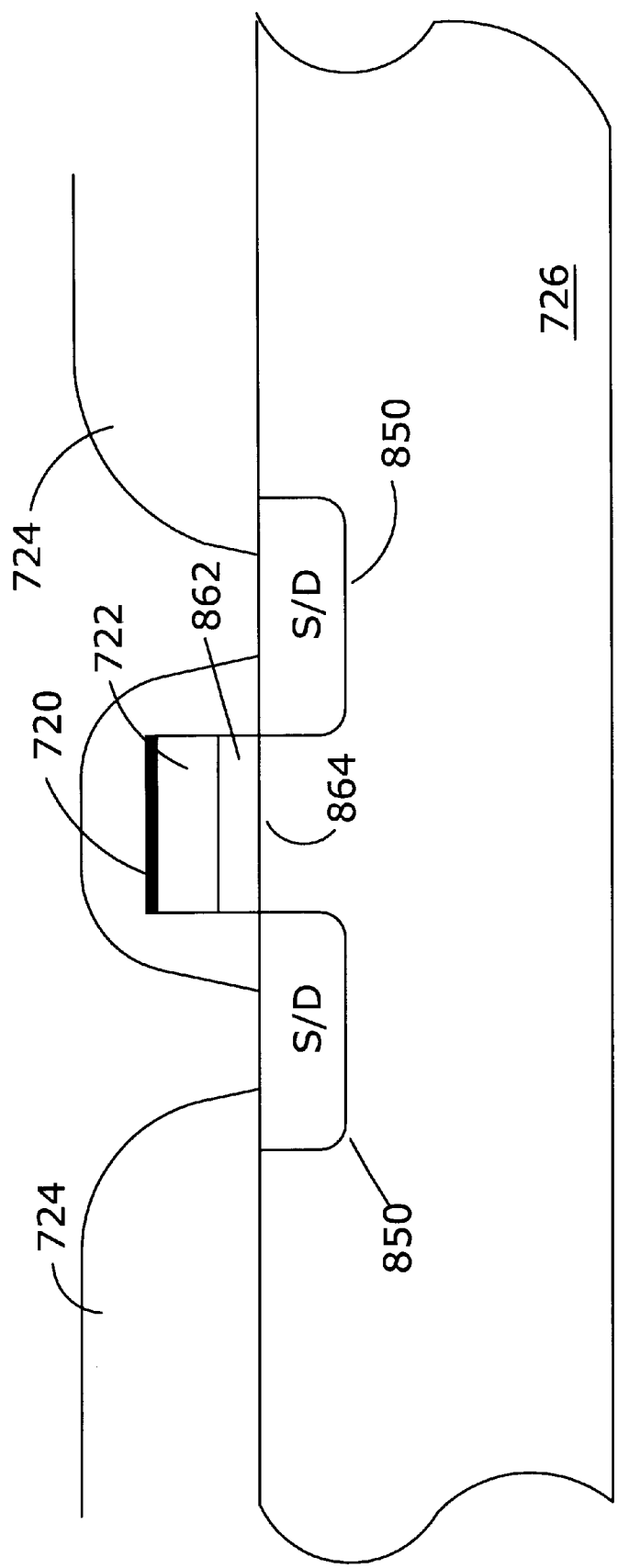

FIG. 8B depicts a plan view of a circuit layout of the inverter 200 according to the present invention. It is apparent from FIG. 8B that FIG. 8A is a cross-sectional view along the polysilicon layer 722 as shown. Cross-sectional views in orthogonal directions through transistor regions are illustrated as indicated in FIGS. 8C and 8D as indicated.

As shown in FIG. 8B, the inverter 200 may be designed using several mask levels corresponding to different semiconductor layers and semiconductor manufacturing processes. Each mask level includes shapes defining regions of similarity for purposes of conducting the manufacturing process at that level. For example, the P-MOSFET 240 may be designed using shapes on several mask levels including a shape 800 defining a N-WELL region in the substrate 726, a shape 804 on a field oxide level defining a transistor region and surrounding areas of field oxide, a shape 802 on a P+ implant level defining a region for implanting P-type impurities into the transistor and surrounding regions, shapes 806 on a contact level where contact to source/drain regions of the transistor 240 are made, and a shape 808 on the polysilicon level 722.

Similarly, the N-MOSFET 220 may be designed using a shape 810 on a field oxide level defining a transistor region and surrounding regions of field oxide, a shape 812 on a N+ implant level defining a region for implanting N-type impurities into the transistor and surrounding regions, shapes 806 on a contact level where contact to source/drain regions of the transistor 240 are made and a the shape 808 on a polysilicon level defining a gate region over the transistor region. The shape 808 also defines a wiring path between the gate regions of the N-MOSFET 220 and P-MOSFET 240 and the terminal 290 of the inverter 200.

Additional shapes may be added according to the present invention to form the alternating N+ and P+ regions in the polysilicon defined by the shape 808 in the polysilicon layer 722. For example, the shapes 820 and 824 on the N+ implant level define regions for implanting N-type impurities into the polysilicon defined by the polysilicon shape 808. The shapes 822 and 826 on the P+ implant level define regions for implanting p-type impurities into the polysilicon defined by the polysilicon shape 808. These shapes create the alternating N+ and P+ regions shown in FIG. 8A. The shapes 828 and 830 may be added on a silicide level to define regions where silicide is not deposited on the polysilicon defined by the shape 808 on the polysilicon level. The shape 828 should be aligned over an interface between shapes on the P+ implant level and the N+ implant level, such as shapes 820 and 822, such that no silicide is formed at the PN junction in the polysilicon defined by the junction of shapes 820 and 822. Shape 830 is similarly aligned to cover the junction of shapes 826 and 824 over shape 808.

As shown in FIGS. 8B and 8C, the polysilicon diodes 210 and 230 are preferably designed generally over a field oxide (FO in FIG. 8C) which separates the two transistors and are thus placed in series with the connection to the gates of the respective transistors. The MOSFETS, themselves, otherwise have a standard, conventional structure, as can be seen particularly in FIG. 8D, and are made in a standard integrated circuit fashion by known and well-understood processes. The preferred dual work function polysilicon will provide N-type polysilicon gate electrodes for N-channel MOSFETS and p-type polysilicon gate electrodes for P-channel MOSFETS.

The shapes 820–830 are preferably designed to form two polysilicon PN junction diodes that are preferably oriented as shown in FIG. 8A with the forward conduction direction toward the gate of the P-MOSFET 240 and the forward conduction direction away from the gate of the N-MOSFET at the gate of each transistor. As shown in FIGS. 8A and 8C, selected, the PN junction diodes are not shunted/strapped by silicide. That is and as shown in FIG. 8B, impurity implant masking is performed simultaneously for the sources, drains, and gates of the transistors of each conductivity type (which, of course, are sequentially masked and implanted for the two differing impurity types or, for example, a gate structure of doped (e.g., N-type) polysilicon deposited and impurities of an opposite conductivity type implanted) using conventional masking and implantation techniques or otherwise providing a sequence of regions doped with different conductivity type impurities.

During manufacture of the semiconductor depicted in FIG. 8B, the additional shapes 820–826 do not generally require additional patterning or implantation process steps. This patterning of the implant resist mask thus provides gate structure having a plurality of PN junctions of alternating orientations in series with the gate of each transistor of the CMOS pair without incurring additional manufacturing process complexity to this point in the manufacturing process.

Subsequently, during manufacture, it is only necessary to cover two PN junctions 728 and 730 (having a desired diode orientation) with the mask shapes 828 and 830 during deposition of the metal used in forming the silicide layer 720. Thus, additional steps of depositing and patterning an oxide to cover the regions defined by shapes 828 and 830 may be required prior to depositing the silicide layer 720. Thus, it is seen that the polysilicon layer 722 and the silicide layer 720, in accordance with the present invention, can be achieved with only a slight implant mask patterning change (with no change in the implant or mask processing relative to dual work function transistors) and a single additional masking operation to avoid strapping or short-circuiting of a desired PN junction. It will be appreciated that in a manufacturing flow where a silicide mask level is present, no additional masking steps beyond those already in the manufacturing flow are required.

It will also be appreciated that changes may be made during design and manufacture in order to implement an appropriate diode junction and diode according to the present invention. For example, shape 808 on the polysilicon level has been illustrated as having the same width in the wiring region between the transistors 220 and 240 and in the wiring region of the transistors 220 and 240. Alternatively, the shape 808 may be made wider or narrower in the wiring region where the diode junction is formed than in the gate regions where the transistors 220 and 240 are formed. Similarly, shapes 820 and 822, for example, have been described as being on the same manufacturing levels as shapes 812 and 802, respectively. However, it will be understood that shapes 820 and 822 may be designed on separate manufacturing levels in order to apply separate amounts of N+ and P+ dopant to the polysilicon on the polysilicon layer 722. Moreover, while the preferred embodiment of the invention is to form a diode junction in the polysilicon layer 722 of the semiconductor, any other type of diode may be formed and advantageously used in accordance with the principles of the invention. For example, the shape 808 on the polysilicon layer may include contact shapes in the wiring region connecting it to diode junctions formed off of the polysilicon layer 722. In this regard, the diode junctions could be any type of diode junctions including PN junctions formed in the semiconductor substrate 726, such as between N+ and P+ diffusions, P+ diffusions and a N-well or a N doped substrate, N+ diffusions and a P-well or a P doped substrate, or any combination thereof. The diode junctions may also formed between a metal, such as gold, and a semiconductor, where the diode characteristics are determined by the work function difference between the metal and the diffusion. The diode junction may also have Zener diode characteristics or any other desired characteristics as long as the diode conducts in both the forward and reverse bias directions within the voltage range defined for switching transistors.

FIG. 8C depicts a cross-section through a manufactured semiconductor along the polysilicon shape 808 shown in FIG. 8B. As shown in FIG. 8C, a wiring region 854 is defined between two gate regions 856. The wiring region 854 is typically over the field oxide 724 and is also where diode junctions 858 are formed within the polysilicon shape. The silicide layer 720 is disposed on the polysilicon shape on the polysilicon layer 722 and is in a conducting relationship with the polysilicon. The silicide layer, however, is not present in diode regions is 860 around the diode junctions 858. This absence of silicide in the diode regions permits the diode characteristic of the diode junctions 858 to be imparted to the interconnect formed by the polysilicon shape and the silicide layer. In each gate region 856, the field oxide is not present, but rather a thin gate oxide 862 is formed between the polysilicon on the polysilicon layer 722 and the source/drain diffusion 850 formed in the substrate 726 or the N well 852. The interface of the polysilicon and the source/drain diffusion 850 forms the MOSFET transistors.

It will be understood that while the wiring and gate regions 854 and 856 are illustrated as laterally disposed with respect to each other, the gate and wiring regions may have other spatial relationships relative to each other, including being vertically disposed relative to each other. Moreover, the term "between" as used herein in reference to the relationship between a diode junction and gate and wiring regions is intended to denote electrically between though not necessarily spatially between.

FIG. 8D illustrates another cross-section along the sectional line indicated in FIG. 8B. FIG. 8D shows more clearly the formation of a MOSFET transistor in the gate region of the polysilicon interconnect 722. The polysilicon shape on the polysilicon layer 722 lies over a thin-gate oxide region 862 over the channel region 864 between the source/drain diffusions 850. The silicide layer 720 is also disposed in an electrically conducting relationship with the underlying polysilicon layer. The source/drain diffusions 850 are in a conducting relationship with a channel 864 formed beneath the polysilicon layer 722. In a preferred embodiment of the invention, the channel 864 is formed when the polysilicon layer 722 and the source/drain regions 850 are formed by implanting N+ impurities in regions defined by the shape 812 on the N+ manufacturing level. This technique for forming the source/drain diffusions 850 and the channel 864 relative to the polysilicon in the gate region 856 is known as a self-aligning process.

Figure 9:
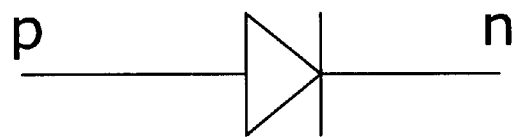
FIG. 9 is a current-voltage characteristic of a polysilicon diode and a silicon diode.
Figure 9:
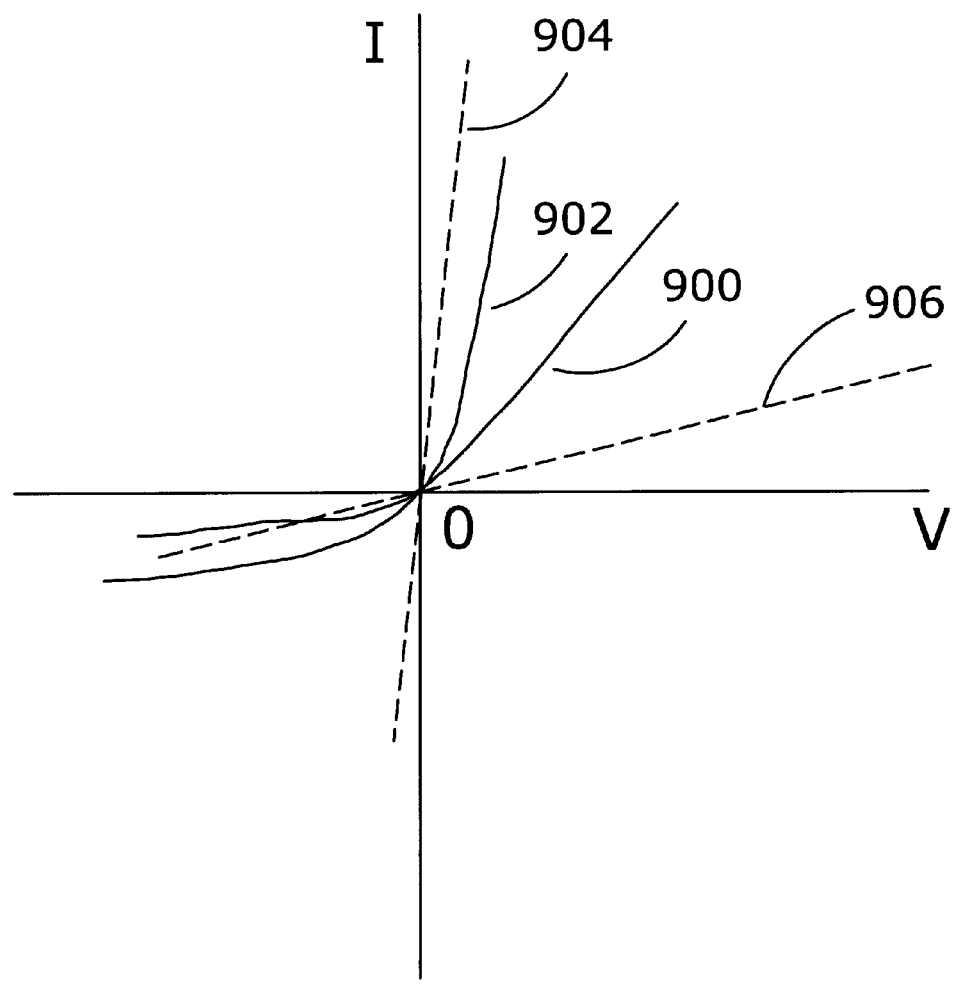

As is recognized by those skilled in the art, PN junction diodes formed in polycrystalline silicon (or other deposited semiconductor material) behave differently than PN junction diodes formed in single crystalline silicon due to the preponderance of grain boundaries in the polycrystalline material. FIG. 9 illustrates the difference between single crystalline silicon and polycrystalline material. As indicated by curve 900, polysilicon diodes have lower forward-bias conductance and a higher reverse-bias leakage than single crystal silicon diodes, as compared with curve 902 which is characteristic of monocrystalline diodes. However, the important element of the behavior of polysilicon diodes in the present invention is significantly higher anode-to-cathode conductance when the diode is forward biased (i.e., when the anode is at a higher potential than the cathode) than when the diode is reverse-biased (i.e., when the cathode is at a higher potential than the anode) particularly as compared to a symmetrically conductive (e.g., resistive) device but lower forward conductance and higher reverse leakage current than a single crystal silicon diode. Also, as compared with a very low resistance which would have a linear conduction characteristic with a relatively large slope, forward conductance and reverse leakage currents differ by a small (especially for small forward or reverse-voltages) but significant value for similar (but oppositely applied) voltage levels across the polysilicon diode although preferably by less than a monocrystalline diode. That is, a symmetrical conduction characteristic, such as would be obtained from a series resistance having a value equal to the slope of the polysilicon diode at near zero bias voltage (e.g., dashed line 904) would slow response relative to the invention (by providing an increased RC time constant for the signal to propagate to the transistor gate) while not engendering hysteresis or skewed switching times of change of conductance state between the transistors. Conversely, a single crystal diode would slow conduction state change to a possibly excessive degree when the input signal reverse biases the diode since lower reverse leakage would have an effect similar to a large resistance (e.g., dashed line 906) and greatly increase the RC time constant for one transistor of the CMOS pair at each input signal transition.

The conductance values can be adjusted over a relatively wide range within the above criteria in numerous ways which will be apparent to those skilled in the art (e.g., structure dimensions, polysilicon grain size, parallel or series connected additional components, dopant concentrations, and the like). However, some of these alternatives (other than altered dimensions and control of polysilicon grain size) would unnecessarily complicate the manufacturing process compared to the preferred embodiment of the invention, especially if additional components, such as a monocrystalline junction diode and parallel resistor, were to be used to develop a similar conduction characteristic. While a simple polysilicon diode having similar impurity concentrations to the source/drain and gate regions is entirely adequate to the practice of the invention to derive the meritorious effects thereof, adjustment of forward and reverse conduction values in the gate structure and interconnect combination can be used to tailor noise immunity and/or power dissipation in conjunction with switching time or speed requirements.

Because of this property of polysilicon diodes, as exploited in the present invention, the orientation of the polysilicon diodes is of lesser importance than the asymmetry and magnitude of currents that can be passed therethrough for similar forward and reverse biases and the invention can be practiced, in principle, with either or both of the polysilicon diodes reversed in polarity relative to the preferred orientation shown in FIG. 2A. The resulting VTC will have hysteresis providing large noise margins, but the short-circuit power would be greater than the short-circuit power dissipated by its counterpart having the preferred diode orientations illustrated since the conduction state changes would be oppositely skewed in time. Accordingly, reversal of the diodes is not, in general, a preferred implementation of the invention but could be advantageously employed, for example, in the thermal design of a chip to reduce temperature variation across a chip.

While specific embodiments of the invention have been described, it will be understood by those having ordinary skill in the art that changes may be made to those embodiments without departing from the spirit and scope of the invention. For example, the modified transistors may be implemented as JFETS or enhancement MOSFET devices. Moreover, while the invention has been described using silicon semiconductors as an example, other materials may be used to implement transistors according to embodiments of the present invention, including Gallium Arsenide, Silicon Germanium, and any other suitable materials.

As will be apparent to those skilled in the art, various changes and modifications may be made to the illustrated low-power CMOS device and logic gates/circuits therewith of the present invention without departing from the spirit and scope of the invention as determined in the appended claims and their legal equivalent.

What is claimed is:

1. A CMOS inverter device switchable between first and second output states in response to corresponding device input states, comprising:
    an integrated circuit having a first MOSFET of a first conductivity type and a second MOSFET of a second conductivity type, said first and second MOSFETs having their channels serially connected for connection between a voltage source and a circuit ground, and
    said first and second MOSFET having respective gates connected in circuit together to define a device input, each gate circuit having a respective PN junction therein, the diode of one gate circuit oppositely poled from the diode of the other gate circuit to provide a different PN junction functionality in each gate circuit in response to different input states to thereby cause said first and second MOSFET to have different relative switching characteristics to minimize the time when both MOSFETs are ON simultaneously at least during switch-over.

2. The CMOS inverter device of claim 1, wherein a turn-ON threshold and a turn-OFF threshold of at least one of said MOSFETs is different from the other consequent to the presence of the PN junction in the gate circuit thereof.

3. The CMOS inverter device of claim 1, wherein a turn-ON threshold and a turn-OFF threshold of both of said MOSFETs are different.

4. The CMOS inverter device of claim 1, wherein said PN junctions introduce a switch-over hysteresis during device switch-over.

5. The CMOS inverter device of claim 1, wherein said inverter device has a dual work-function polysilicon layer having P regions and N regions defining at least two PN junctions at the interface of said P regions and N regions and a conductive silicide layer formed over at least part of said polysilicon layer, the silicide of said conductive silicide layer absent in the area of the PN junctions to define said respective PN junctions as functioning polysilicon PN junctions in said gate circuits.

6. The CMOS inverter device of claim 1 further including the step of operating said device by applying a signal to said input terminal to propagate said signal through said diode junctions to said gates to cause the conduction states of each of said MOSFETs to change.

7. The CMOS inverter device of claim 1, wherein a turn-ON threshold of at least a one of said MOSFETs is made to differ, as a function of said diode junction, from a turn-OFF threshold of said transistor.

8. A method of operating the CMOS inverter of claim 1, comprising the setp of applying an input signal to the device input to propagate the input signal through the PN diodes of each gate circuit to cause said MOSFETs to change conduction states with their respective ON times different from each other to minimize the time when both MOSFETs are ON simultaneously during switch-over.

9. A logic circuit having multiple logic states and having at least one CMOS inverter therein switchable between first and second inverter states in response to corresponding input states, comprising:
    integrated circuit having a first MOSFET of a first conductivity type and a second MOSFET of a second conductivity type, said first and second MOSFETs having their channels in circuit with each other for connection between a voltage source and a circuit ground, and
    said first and second MOSFET having respective gates connected in circuit together to define a device input, each gate circuit having a respective PN junction therein, the diode of one gate circuit oppositely poled from the diode of the other gate circuit to provide a different PN junction functionality in each gate circuit in response to different input states to thereby cause said first and second MOSFET to have different relative switching characteristics to minimize the time when both MOSFETs are ON simultaneously at least during switch-over.

10. The logic circuit of claim 9, wherein a turn-ON threshold and a turn-OFF threshold of at least one of said MOSFETs is different from the other consequent to the presence of the PN junction in the gate circuit thereof.

11. The logic circuit of claim 9, wherein a turn-ON threshold and a turn-OFF threshold of both of said MOSFETs are different.

12. The logic circuit of claim 9, wherein said PN junctions introduce a switch-over hysteresis during device switch-over.

13. The logic circuit of claim 9, wherein said inverter device has a dual work-function polysilicon layer having P regions and N regions defining at least two PN junctions at the interface of said P regions and N regions and a conductive silicide layer formed over at least part of said polysilicon layer, the silicide of said conductive silicide layer absent in the area of the PN junctions to define said respective PN junctions as functioning polysilicon PN junctions in said gate circuits.

14. The logic circuit of claim 9, further including the step of operating said device by applying a signal to said input terminal to propagate said signal through said diode junctions to said gates to cause the conduction states of each of said MOSFETs to change.

15. The logic circuit of claim 9, wherein a turn-ON threshold of at least a one of said MOSFETs is made to differ, as a function of said diode-junction, from a turn-OFF threshold of said transistor.

16. The logic circuit of claim 9, wherein said logic circuit is part of a larger system including at least a programmed or programmable micro-processor.

17. A method of operating the logic circuit of claim 9, comprising the step of applying an input signal to the device input to propagate the input signal through the PN diodes of each gate circuit to cause said MOSFETs to change conduction states with their respective ON times different from each other to minimize the time when both MOSFETs are ON simultaneously during switch-over.

18. A method of fabricating the gate circuits of a dual work-function CMOS inverter device switchable between first and second output states in response to corresponding device input states, the dual work-function CMOS inverter device having first and second channels in circuit with each other and formed in a layer thereof and a gate oxide layer thereover, comprising:

forming a polycrystalline or polysilicon layer over the gate oxide to define gate regions for said first and second channels;

implanting impurities into said polycrystalline layer to form at least two different PN junctions, a one of said PN junctions associated with a corresponding one of said channels and the other of said PN junctions associated with the other of said channels;

forming a overlying conductive layer with openings selectively formed in the overlying conductive layer in the region of said PN junctions in said polycrystalline or polysilicon layer to enable PN functionality in each PN junction, the overlying conductive layer and respective PN junctions forming a device input for the CMOS inverter device.

19. The method of claim 18, herein the overlying conductive layer is a silicide.

20. The method according to claim 18, wherein said polycrystalline is silicon.

21. A method of fabricating a dual work-function CMOS inverter device switchable between first and second output states in response to corresponding device input states, forming a layer on a substrate, the layer having first and second channels therein connected in circuit;

forming a gate oxide over said channel layer;

forming a polycrystalline or polysilicon layer over the gate oxide to define gate regions for each of said first and second channels;

implanting impurities into said polycrystalline layer to form at least two different PN junctions, a one of said PN junctions associated with a corresponding one of said channels and the other of said PN junctions associated with the other of said channels;

forming a conductive layer overlying said polycrystalline or polysilicon layer to define gate wiring, said conductive layer having openings selectively formed therein in the region of said PN junctions in said polycrystalline or poly-silicon layer to enable PN functionality in each PN junction, the gate wiring and respective PN junctions forming a device input for the CMOS inverter device.

22. The method of claim 21, wherein the overlying conductive layer is a silicide.

23. The method according to claim 21, wherein said polycrystalline is silicon.

* * * * *